(12) United States Patent
Huang et al.

(10) Patent No.: US 8,144,512 B2
(45) Date of Patent: Mar. 27, 2012

(54) DATA TRANSFER FLOWS FOR ON-CHIP FOLDING

(75) Inventors: Jianmin Huang, Sunnyvale, CA (US); Chris Avila, Sunnyvale, CA (US); Lee M. Gavens, Milpitas, CA (US); Neil David Hutchinson, Larbert (GB); Sergey Anatolievich Gorobets, Edinburgh (GB)

(73) Assignee: SanDisk Technologies Inc., Plano, TX (US)

( * ) Notice: Subject to any disclaimer, the term of this patent is extended or adjusted under 35 U.S.C. 154(b) by 295 days.

(21) Appl. No.: 12/642,649

(22) Filed: Dec. 18, 2009

(65) Prior Publication Data

US 2011/0149650 A1  Jun. 23, 2011

(51) Int. Cl.
*G11C 11/34* (2006.01)
(52) U.S. Cl. .............................. 365/185.03; 365/185.24
(58) Field of Classification Search ............. 365/185.03, 365/185.24
See application file for complete search history.

(56) References Cited

U.S. PATENT DOCUMENTS

| | | |
|---|---|---|
| 3,710,348 A | 1/1973 | Craft |
| 3,895,360 A | 7/1975 | Cricchi et al. |
| 4,357,685 A | 11/1982 | Daniele et al. |
| 4,426,688 A | 1/1984 | Moxley |
| 4,720,815 A | 1/1988 | Ogawa |
| 4,757,477 A | 7/1988 | Nagayama et al. |
| 5,070,032 A | 12/1991 | Yuan et al. |
| 5,095,344 A | 3/1992 | Harari |
| 5,172,338 A | 12/1992 | Mehrotra et al. |
| 5,200,959 A | 4/1993 | Gross et al. |
| 5,270,979 A | 12/1993 | Harari et al. |

(Continued)

FOREIGN PATENT DOCUMENTS

CN  1549133  11/2004

(Continued)

OTHER PUBLICATIONS

Eitan et al., "NROM: A Novel Localized Trapping, 2-Bit Nonvolatile Memory Cell," *IEEE Electron Device Letters*, vol. 21, No. 11, Nov. 2000, pp. 543-545.

(Continued)

*Primary Examiner* — Michael Tran
(74) *Attorney, Agent, or Firm* — Davis Wright Tremaine LLP

(57) ABSTRACT

A memory system and methods of its operation are presented. The memory system includes a volatile buffer memory and a non-volatile memory circuit, where the non-volatile memory circuit has a first section, where data is stored in a binary format, and a second section, where data is stored in a multi-state format. When writing data to the non-volatile memory, the data is received from a host, stored in the buffer memory, transferred from the buffer memory to into read/write registers of the non-volatile memory circuit, and then written from the read/write registers to the first section of the non-volatile memory circuit using a binary write operation. Portions of the data and then subsequently folded from the first section of the non-volatile memory to the second section of the non-volatile memory, where a folding operation includes reading the portions of the data from multiple locations in the first section into the read/write registers and performing a multi-state programming operation of the portions of the data from the read/write registers into a location the second section of the non-volatile memory. The multi-state programming operations include a first phase and a second phase and one or more of the binary write operations are performed between the phases of the multi-state programming operations.

11 Claims, 30 Drawing Sheets

U.S. PATENT DOCUMENTS

| | | | |
|---|---|---|---|
| 5,313,421 | A | 5/1994 | Guterman et al. |
| 5,315,541 | A | 5/1994 | Harari et al. |
| 5,343,063 | A | 8/1994 | Yuan et al. |
| 5,380,672 | A | 1/1995 | Yuan et al. |
| 5,386,390 | A | 1/1995 | Okitaka |
| 5,418,752 | A | 5/1995 | Harari et al. |
| 5,428,621 | A | 6/1995 | Mehrotra et al. |
| 5,430,679 | A | 7/1995 | Hiltebeitel et al. |
| 5,430,859 | A | 7/1995 | Norman et al. |
| 5,442,748 | A | 8/1995 | Chang et al. |
| 5,479,370 | A | 12/1995 | Furuyama et al. |
| 5,485,425 | A | 1/1996 | Iwai et al. |
| 5,570,315 | A | 10/1996 | Tanaka et al. |
| 5,595,924 | A | 1/1997 | Yuan et al. |
| 5,602,987 | A | 2/1997 | Harari et al. |
| 5,642,312 | A | 6/1997 | Harari |
| 5,657,332 | A | 8/1997 | Auclair et al. |
| 5,661,053 | A | 8/1997 | Yuan |
| 5,663,901 | A | 9/1997 | Wallace et al. |
| 5,712,180 | A | 1/1998 | Guterman et al. |
| 5,768,192 | A | 6/1998 | Eitan |
| 5,774,397 | A | 6/1998 | Endoh et al. |
| 5,783,958 | A | 7/1998 | Lysinger |
| 5,822,245 | A | 10/1998 | Gupta et al. |
| 5,848,009 | A | 12/1998 | Lee et al. |
| 5,862,080 | A | 1/1999 | Harari et al. |
| 5,890,192 | A | 3/1999 | Lee et al. |
| 5,903,495 | A | 5/1999 | Takeuchi et al. |
| 5,930,167 | A | 7/1999 | Lee et al. |
| 5,936,971 | A | 8/1999 | Harari et al. |
| 6,011,725 | A | 1/2000 | Eitan |
| 6,021,463 | A | 2/2000 | Belser |
| 6,038,167 | A | 3/2000 | Miwa et al. |
| 6,038,184 | A | 3/2000 | Naritake |
| 6,046,935 | A | 4/2000 | Takeuchi et al. |
| 6,091,666 | A | 7/2000 | Arase et al. |
| 6,151,248 | A | 11/2000 | Harari et al. |
| 6,222,762 | B1 | 4/2001 | Guterman et al. |
| 6,230,233 | B1 | 5/2001 | Lofgren et al. |
| 6,252,800 | B1 | 6/2001 | Chida |
| 6,266,273 | B1 | 7/2001 | Conley et al. |
| 6,282,624 | B1 | 8/2001 | Kimura et al. |
| 6,353,553 | B1 | 3/2002 | Tamada et al. |
| 6,426,893 | B1 | 7/2002 | Conley et al. |
| 6,456,528 | B1 | 9/2002 | Chen |
| 6,480,423 | B2 | 11/2002 | Toda et al. |
| 6,510,488 | B2 | 1/2003 | Lasser |
| 6,512,263 | B1 | 1/2003 | Yuan et al. |
| 6,522,580 | B2 | 2/2003 | Chen et al. |
| 6,523,132 | B1 | 2/2003 | Harari et al. |
| 6,560,146 | B2 | 5/2003 | Cernea |
| 6,567,307 | B1 | 5/2003 | Estakhri |
| 6,581,142 | B1 | 6/2003 | Jacobs |
| 6,594,177 | B2 | 7/2003 | Matarrese et al. |
| 6,643,180 | B2 | 11/2003 | Ikehashi et al. |
| 6,657,891 | B1 | 12/2003 | Shibata et al. |
| 6,771,536 | B2 | 8/2004 | Li et al. |
| 6,813,184 | B2 | 11/2004 | Lee |
| 6,853,596 | B2 | 2/2005 | Cheung |
| 6,870,768 | B2 | 3/2005 | Cernea et al. |
| 6,990,018 | B2 | 1/2006 | Tanaka et al. |
| 7,027,330 | B2 | 4/2006 | Park |
| 7,039,781 | B2 | 5/2006 | Iwata et al. |
| 7,057,339 | B2 | 6/2006 | Boroson et al. |
| 7,058,818 | B2 | 6/2006 | Dariel |
| 7,076,611 | B2 | 7/2006 | Steere et al. |
| 7,110,294 | B2 | 9/2006 | Kawai |
| 7,158,421 | B2 | 1/2007 | Li et al. |
| 7,170,802 | B2 | 1/2007 | Cernea et al. |
| 7,206,230 | B2 | 4/2007 | Li et al. |
| 7,224,605 | B1 | 5/2007 | Moogat |
| 7,299,314 | B2 | 11/2007 | Lin et al. |
| 7,310,347 | B2 | 12/2007 | Lasser |
| 7,345,928 | B2 | 3/2008 | Li |
| 7,405,985 | B2 | 7/2008 | Cernea et al. |
| 7,420,847 | B2 | 9/2008 | Li |
| 7,426,623 | B2 | 9/2008 | Lasser |
| 7,447,070 | B2 | 11/2008 | Cernea |
| 7,490,283 | B2 | 2/2009 | Gorobets et al. |
| 7,493,457 | B2 | 2/2009 | Murin |
| 7,502,254 | B2 | 3/2009 | Murin et al. |
| 7,502,259 | B2 | 3/2009 | Gorobets |
| 2001/0000023 | A1 | 3/2001 | Kawahara et al. |
| 2003/0007385 | A1 | 1/2003 | Hosono et al. |
| 2003/0182317 | A1 | 9/2003 | Kahn et al. |
| 2003/0223274 | A1 | 12/2003 | Cernea |
| 2004/0060031 | A1 | 3/2004 | Cernea |
| 2004/0109357 | A1 | 6/2004 | Cernea et al. |
| 2005/0213393 | A1 | 9/2005 | Lasser |
| 2006/0126390 | A1 | 6/2006 | Gorobets et al. |
| 2006/0136656 | A1 | 6/2006 | Conley et al. |
| 2007/0061502 | A1 | 3/2007 | Lasser |
| 2007/0065119 | A1 | 3/2007 | Pomerantz |
| 2007/0091677 | A1 | 4/2007 | Lasser et al. |
| 2007/0103977 | A1 | 5/2007 | Conley et al. |
| 2007/0103978 | A1 | 5/2007 | Conley et al. |
| 2007/0159652 | A1* | 7/2007 | Sato .......................... 358/1.15 |
| 2007/0180346 | A1 | 8/2007 | Murin |
| 2007/0211530 | A1 | 9/2007 | Nakano |
| 2007/0220197 | A1 | 9/2007 | Lasser |
| 2007/0220935 | A1 | 9/2007 | Cernea |
| 2007/0237006 | A1 | 10/2007 | Murin et al. |
| 2007/0260808 | A1 | 11/2007 | Raines et al. |
| 2007/0268745 | A1 | 11/2007 | Lasser |
| 2007/0283081 | A1 | 12/2007 | Lasser |
| 2007/0285980 | A1 | 12/2007 | Shimizu et al. |
| 2008/0062761 | A1 | 3/2008 | Tu et al. |
| 2008/0104312 | A1 | 5/2008 | Lasser |
| 2008/0147996 | A1 | 6/2008 | Jenkins et al. |
| 2008/0159012 | A1 | 7/2008 | Kim |
| 2008/0181000 | A1 | 7/2008 | Lasser |
| 2008/0209112 | A1 | 8/2008 | Yu et al. |
| 2008/0244338 | A1 | 10/2008 | Mokhlesi et al. |
| 2008/0244367 | A1 | 10/2008 | Chin et al. |
| 2008/0250220 | A1 | 10/2008 | Ito |
| 2008/0250300 | A1 | 10/2008 | Mokhlesi et al. |
| 2008/0301532 | A1 | 12/2008 | Uchikawa et al. |
| 2009/0067244 | A1 | 3/2009 | Li et al. |
| 2009/0089481 | A1 | 4/2009 | Kapoor et al. |
| 2009/0089520 | A1 | 4/2009 | Saha et al. |
| 2009/0094482 | A1 | 4/2009 | Zilberman |
| 2009/0172498 | A1 | 7/2009 | Shlick et al. |
| 2010/0107004 | A1 | 4/2010 | Bottelli et al. |
| 2010/0157641 | A1 | 6/2010 | Shalvi et al. |
| 2010/0172179 | A1 | 7/2010 | Gorobets et al. |
| 2010/0172180 | A1 | 7/2010 | Paley et al. |
| 2010/0174845 | A1 | 7/2010 | Gorobets et al. |
| 2010/0174846 | A1 | 7/2010 | Paley et al. |
| 2010/0174847 | A1 | 7/2010 | Paley et al. |
| 2011/0063909 | A1 | 3/2011 | Komatsu |
| 2011/0099460 | A1 | 4/2011 | Dusija et al. |

FOREIGN PATENT DOCUMENTS

| | | |
|---|---|---|
| JP | 61292747 A | 12/1986 |
| JP | 1128297 | 5/1989 |
| JP | 06150666 A | 5/1994 |
| WO | WO 98/44420 | 10/1998 |
| WO | WO 00/49488 | 8/2000 |
| WO | WO 03/025939 A2 | 3/2003 |
| WO | WO 03/027828 | 4/2003 |
| WO | WO 2006/064318 | 6/2006 |
| WO | WO 2007/141783 | 12/2007 |

OTHER PUBLICATIONS

U.S. Appl. No. 11/026,536 entitled "Non-Volatile Memory and Method with Shared Processing for an Aggregate of Read/Write Circuits," filed Dec. 29, 2004, 50 pages.

U.S. Appl. No. 61/142,620 entitled "Non-Volatile Memory and Method With Improved Block Management System," filed Jan. 5, 2009, 144 pages.

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Having Flush/Eviction Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 12/051,462 entitled "Adaptive Algorithm in Cache Operation with Dynamic Data Latch Requirements," filed Mar. 19, 2008, 20 pages.

U.S. Appl. No. 12/051,492 entitled "Different Combinations of Wordline Order and Look-Ahead Read to Improve Flash Memory Performance," filed Mar. 19, 2008, 20 pages.

U.S. Appl. No. 12/478,997 entitled Folding Data Stored in Binary Format into Multi-State Format Within Non-Volatile Devices, filed Jun. 5, 2009, 52 pages.

"Numonyx Sector-Based Compact File System (SCFS) Software is a Feature-Rich Flash Solution," *Numonyx*, 2009, 2 pages.

"SanDisk, Toshiba Develop 32-Nanometer NAND Flash Technology," *SanDisk Corporation and Toshiba Corporation*, Feb. 11, 2009, www.physorg.com/news153597019.html, 9 pages.

Choudhuri et al., "Performance Improvement of Block Based NAND Flash Translation Layer," CODES + ISSS '07, Salzburg, Austria, pp. 257-262.

U.S. Appl. No. 12/642,740 entitled "Atomic Program Sequence and Write Abort Detection," filed Dec. 18, 2009, 60 pages.

Notification of Transmittal of the International Search Report and the Written Opinion of the International Searching Authority, or the Declaration for International Application No. PCT/US2010/060855 dated Feb. 21, 2011, 13 pages.

\* cited by examiner

Programming into Four States Represented by a 2-bit Code

Lower Page Read (2-bit Code)

Upper Page Read (2-bit Code)

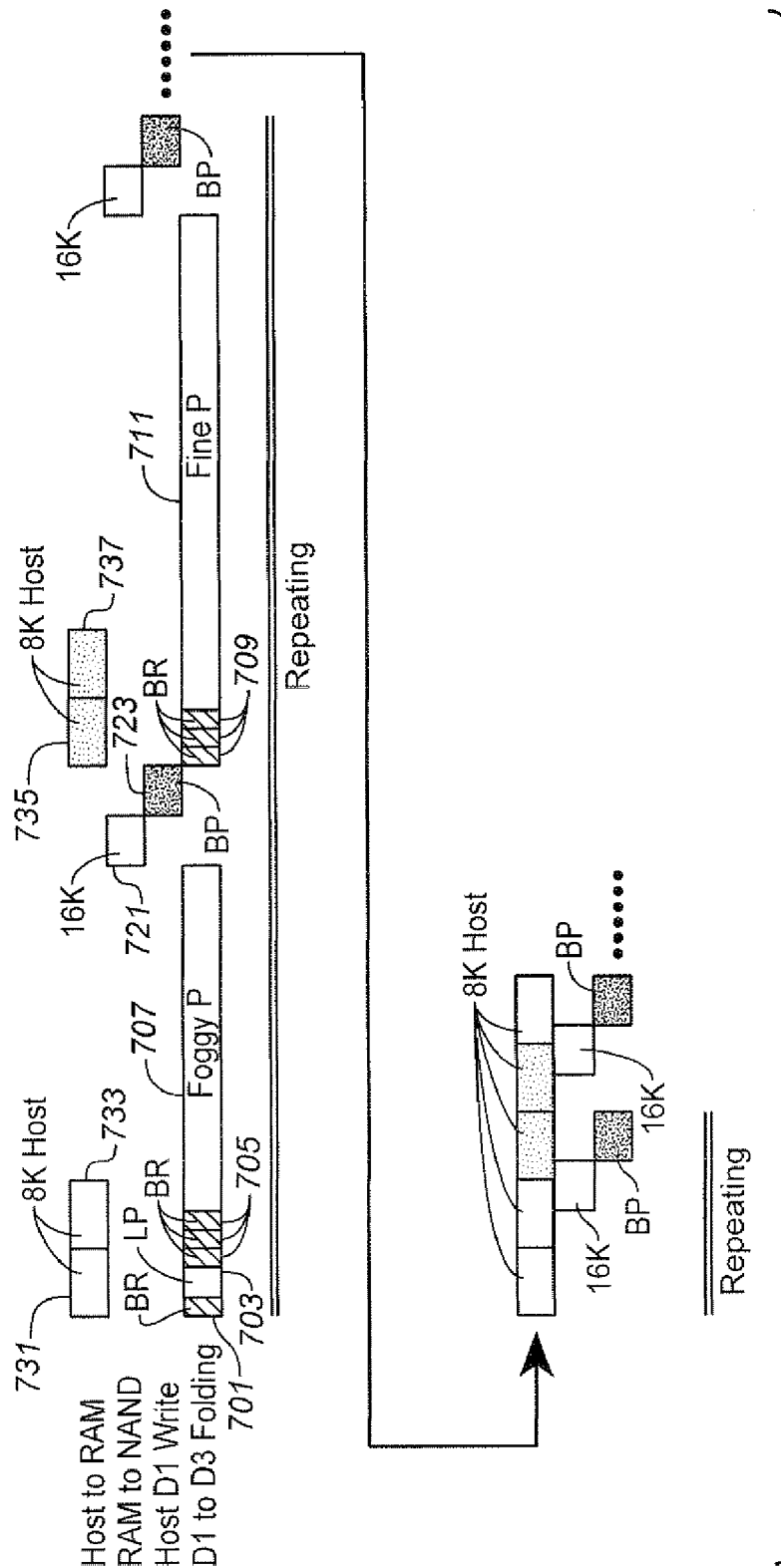

DATA TRANSFER FLOWS FOR ON-CHIP FOLDING

CROSS-REFERENCE TO RELATED PATENT APPLICATIONS

This application is related to the following United States patent applications: one entitled "Non-Volatile Memory with Multi-Gear Control Using On-Chip Folding of Data" by Huang et al. and having U.S. Published Application No. 2011/0153913A1; and one entitled "Maintaining Updates of Multi-Level Non-Volatile Memory in Binary Non-volatile Memory" by Gorobets et al. and having U.S. Published Application No. 1022/0153912A1, both of which are being filed concurrently herewith.

BACKGROUND

This application relates to the operation of re-programmable non-volatile memory systems such as semiconductor flash memory, and, more specifically, to the management of the interface between a host device and the memory.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retaining its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate. While the term "program" has been used historically to describe writing to a memory by injecting electrons to an initially erased charge storage unit of the memory cell so as to alter the memory state, it has now been used interchangeable with more common terms such as "write" or "record."

The memory device may be erased by a number of mechanisms. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more minimum erasable blocks at a time, where a minimum erasable block may consist of one or more sectors and each sector may store 512 bytes or more of data.

The memory device typically comprises one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

In flash memory systems, erase operation may take as much as an order of magnitude longer than read and program operations. Thus, it is desirable to have the erase block of substantial size. In this way, the erase time is amortized over a large aggregate of memory cells.

The nature of flash memory predicates that data must be written to an erased memory location. If data of a certain logical address from a host is to be updated, one way is rewrite the update data in the same physical memory location. That is, the logical to physical address mapping is unchanged. However, this will mean the entire erase block contain that physical location will have to be first erased and then rewritten with the updated data. This method of update is inefficient, as it requires an entire erase block to be erased and rewritten, especially if the data to be updated only occupies a small portion of the erase block. It will also result in a higher frequency of erase recycling of the memory block, which is undesirable in view of the limited endurance of this type of memory device.

Data communicated through external interfaces of host systems, memory systems and other electronic systems are addressed and mapped into the physical locations of a flash memory system. Typically, addresses of data files generated or received by the system are mapped into distinct ranges of a continuous logical address space established for the system in terms of logical blocks of data (hereinafter the "LBA interface"). The extent of the address space is typically sufficient to cover the full range of addresses that the system is capable of handling. In one example, magnetic disk storage drives communicate with computers or other host systems through such a logical address space. This address space has an extent sufficient to address the entire data storage capacity of the disk drive.

Flash memory systems are most commonly provided in the form of a memory card or flash drive that is removably connected with a variety of hosts such as a personal computer, a camera or the like, but may also be embedded within such host systems. When writing data to the memory, the host typically assigns unique logical addresses to sectors, clusters or other units of data within a continuous virtual address space of the memory system. Like a disk operating system (DOS), the host writes data to, and reads data from, addresses within the logical address space of the memory system. A controller within the memory system translates logical addresses received from the host into physical addresses within the memory array, where the data are actually stored, and then keeps track of these address translations. The data storage capacity of the memory system is at least as large as the amount of data that is addressable over the entire logical address space defined for the memory system.

In current commercial flash memory systems, the size of the erase unit has been increased to a block of enough memory cells to store multiple sectors of data. Indeed, many pages of data are stored in one block, and a page may store multiple sectors of data. Further, two or more blocks are often operated together as metablocks, and the pages of such blocks logically linked together as metapages. A page or metapage of data are written and read together, which can include many sectors of data, thus increasing the parallelism of the operation. Along with such large capacity operating units the challenge is to operate them efficiently.

For ease of explanation, unless otherwise specified, it is intended that the term "block" as used herein refer to either the block unit of erase or a multiple block "metablock," depending upon whether metablocks are being used in a specific system. Similarly, reference to a "page" herein may refer to a unit of programming within a single block or a "metapage" within a metablock, depending upon the system configuration.

When the currently prevalent LBA interface to the memory system is used, files generated by a host to which the memory is connected are assigned unique addresses within the logical address space of the interface. The memory system then commonly maps data between the logical address space and pages of the physical blocks of memory. The memory system keeps track of how the logical address space is mapped into the physical memory but the host is unaware of this. The host keeps track of the addresses of its data files within the logical address space but the memory system operates with little or no knowledge of this mapping.

Another problem with managing flash memory system has to do with system control and directory data. The data is produced and accessed during the course of various memory operations. Thus, its efficient handling and ready access will directly impact performance. It would be desirable to maintain this type of data in flash memory because flash memory is meant for storage and is nonvolatile. However, with an intervening file management system between the controller and the flash memory, the data can not be accessed as directly. Also, system control and directory data tends to be active and fragmented, which is not conducive to storing in a system with large size block erase. Conventionally, this type of data is set up in the controller RAM, thereby allowing direct access by the controller. After the memory device is powered up, a process of initialization enables the flash memory to be scanned in order to compile the necessary system control and directory information to be placed in the controller RAM. This process takes time and requires controller RAM capacity, all the more so with ever increasing flash memory capacity.

U.S. Pat. No. 6,567,307 discloses a method of dealing with sector updates among large erase block including recording the update data in multiple erase blocks acting as scratch pad and eventually consolidating the valid sectors among the various blocks and rewriting the sectors after rearranging them in logically sequential order. In this way, a block needs not be erased and rewritten at every slightest update.

WO 03/027828 and WO 00/49488 both disclose a memory system dealing with updates among large erase block including partitioning the logical sector addresses in zones. A small zone of logical address range is reserved for active system control data separate from another zone for user data. In this way, manipulation of the system control data in its own zone will not interact with the associated user data in another zone. Updates are at the logical sector level and a write pointer points to the corresponding physical sectors in a block to be written. The mapping information is buffered in RAM and eventually stored in a sector allocation table in the main memory. The latest version of a logical sector will obsolete all previous versions among existing blocks, which become partially obsolete. Garbage collection is performed to keep partially obsolete blocks to an acceptable number.

Prior art systems tend to have the update data distributed over many blocks or the update data may render many existing blocks partially obsolete. The result often is a large amount of garbage collection necessary for the partially obsolete blocks, which is inefficient and causes premature aging of the memory. Also, there is no systematic and efficient way of dealing with sequential update as compared to non-sequential update.

Flash memory with a block management system employing a mixture of sequential and chaotic update blocks is disclosed in United States Patent Publication No. US-2005-0144365-A1 dated Jun. 30, 2005, the entire disclosure of which is incorporated herein by reference.

Prior art has disclosed flash memory systems operating with a cache and operating in mixed MLC (multi-level cell) and SLC (single-level cell) modes and with the SLC memory operating as a dedicated cache. However, the cache disclosed is mainly to buffer the data between a fast host and a slower MLC memory and for accumulation to write to a block. These systems mostly treat the cache memory at a high level as storage and ignoring the underlying low level operating considerations of the block structure and its update scheme. The following publications are examples of these prior art.

Using RAM in a write cache operating with a flash memory has been disclosed in U.S. Pat. No. 5,936,971 to Harari et al.

Partitioning the memory into two portions one operating in binary and the other in MLC has been disclosed in U.S. Pat. No. 5,930,167 to Lee et al and U.S. Pat. No. 6,456,528 to Chen, the entire disclosure of which is incorporated therein by reference.

United States Patent Publication Number: Publication Number: US-2007-0061502-A1 on Mar. 15, 2007 and US-2007-0283081-A1 dated Dec. 6, 2007 by Lasser both disclose a flash memory operating in mixed MLC and SLC modes. A specific portion of the memory is always allocated to operate in SLC mode and to serve as a dedicated cache.

Therefore there is a general need for high capacity and high performance non-volatile memory. In particular, there is a need to have a high capacity nonvolatile memory able to conduct memory operations in large blocks without the aforementioned problems.

SUMMARY OF THE INVENTION

According to a general aspect of the invention, a method of operating a memory system is presented. The memory system includes a volatile buffer memory and a non-volatile memory circuit, where the non-volatile memory circuit has a first portion, where data is stored in a binary format, and a second portion, where data is stored in a multi-state format. The method includes receiving data from a host and storing the received data in the buffer memory. The data is then transferred from the buffer memory to into read/write registers of the non-volatile memory circuit and a binary write operation of the data is then performed from the read/write registers to the first section of the non-volatile memory circuit. The method then subsequently folds portions of the data from the first section of the non-volatile memory to the second section of the non-volatile memory, wherein a folding operation includes reading the portions of the data from multiple locations in the first section into the read/write registers and performing a multi-state programming operation of the portions of the data from the read/write registers into a location the second section of the non-volatile memory. The multi-state programming operations include a first phase and a second phase and one or more binary write operations are performed between the phases of the multi-state programming operations.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes.

To the extent of any inconsistency or conflict in the definition or use of terms between any of the incorporated publications, documents or things and the present application, those of the present application shall prevail.

BRIEF DESCRIPTION OF THE DRAWINGS

FIG. 21 shows timing for an exemplary single die data transfer flow.

DETAILED DESCRIPTION

Memory System

FIG. 1 to FIG. 7 provide example memory systems in which the various aspects of the present invention may be implemented or illustrated.

FIG. 8 to FIG. 13 illustrate one memory and block architecture for implementing the various aspects of the present invention.

Figure 1:
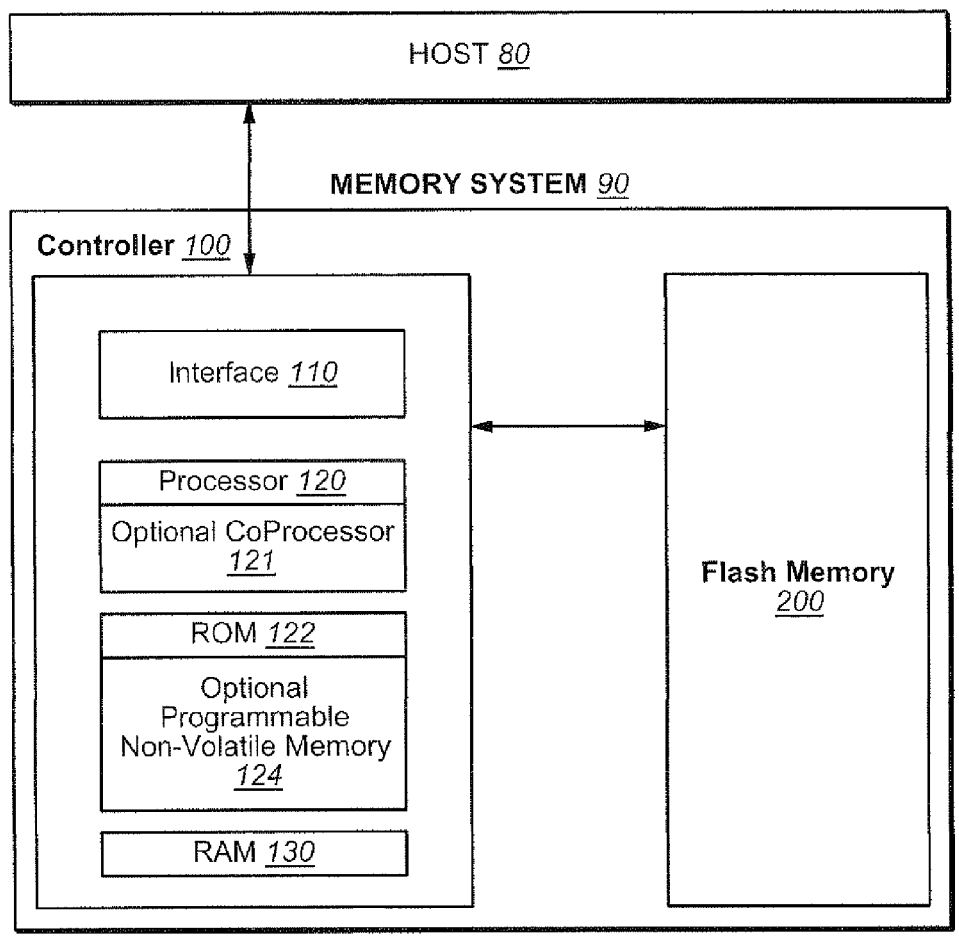
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
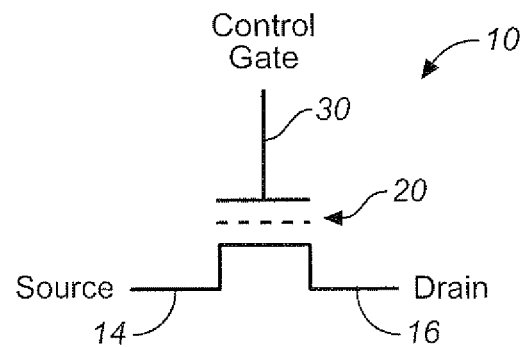
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
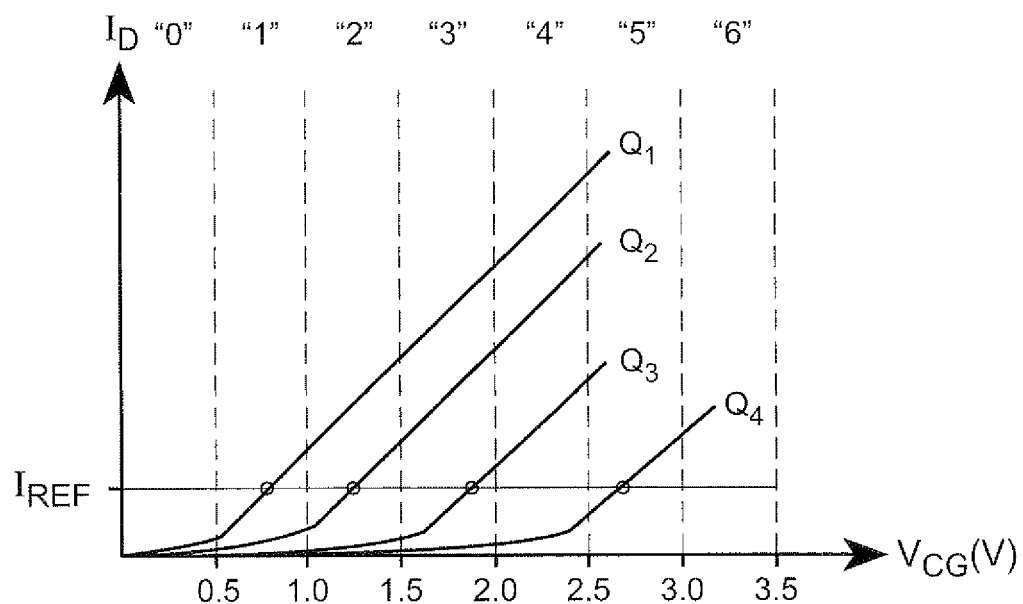
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
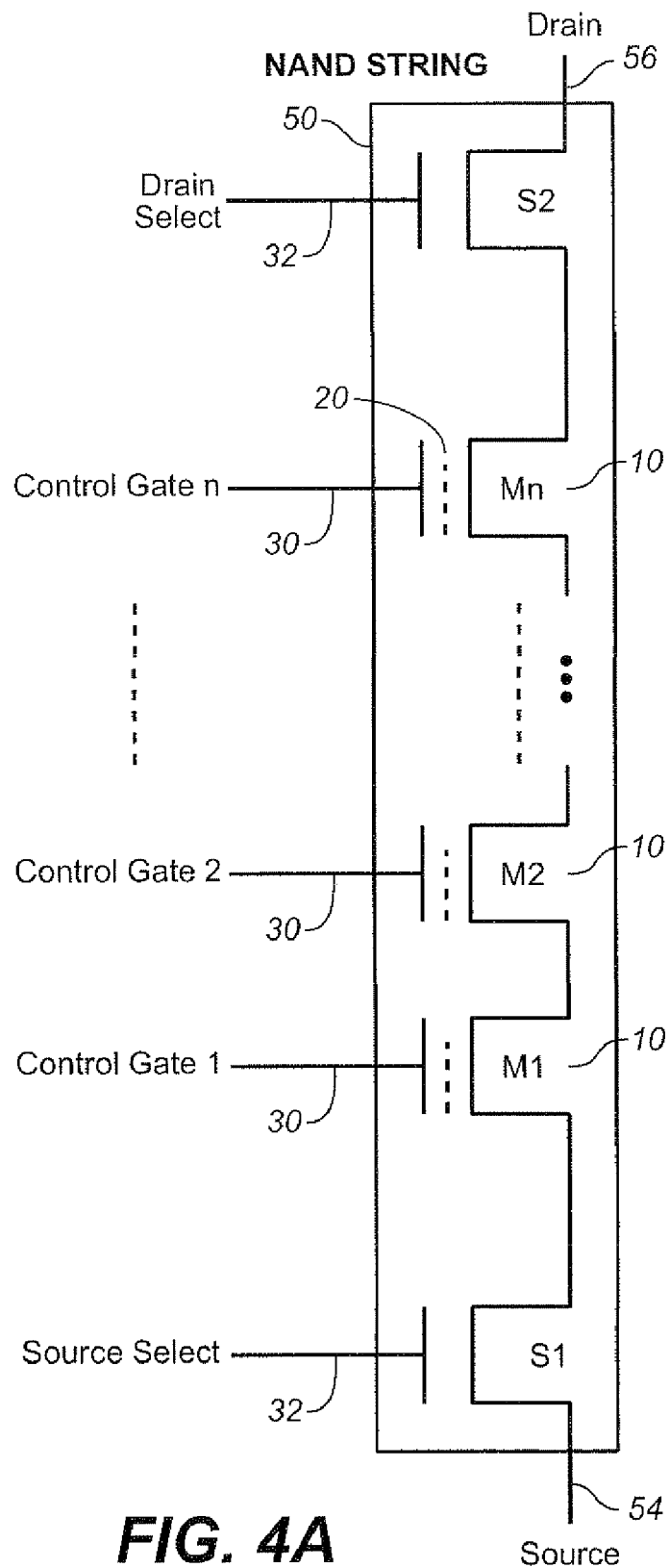
FIG. 4A illustrates schematically a string of memory cells organized into an NAND string.

FIG. 4A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
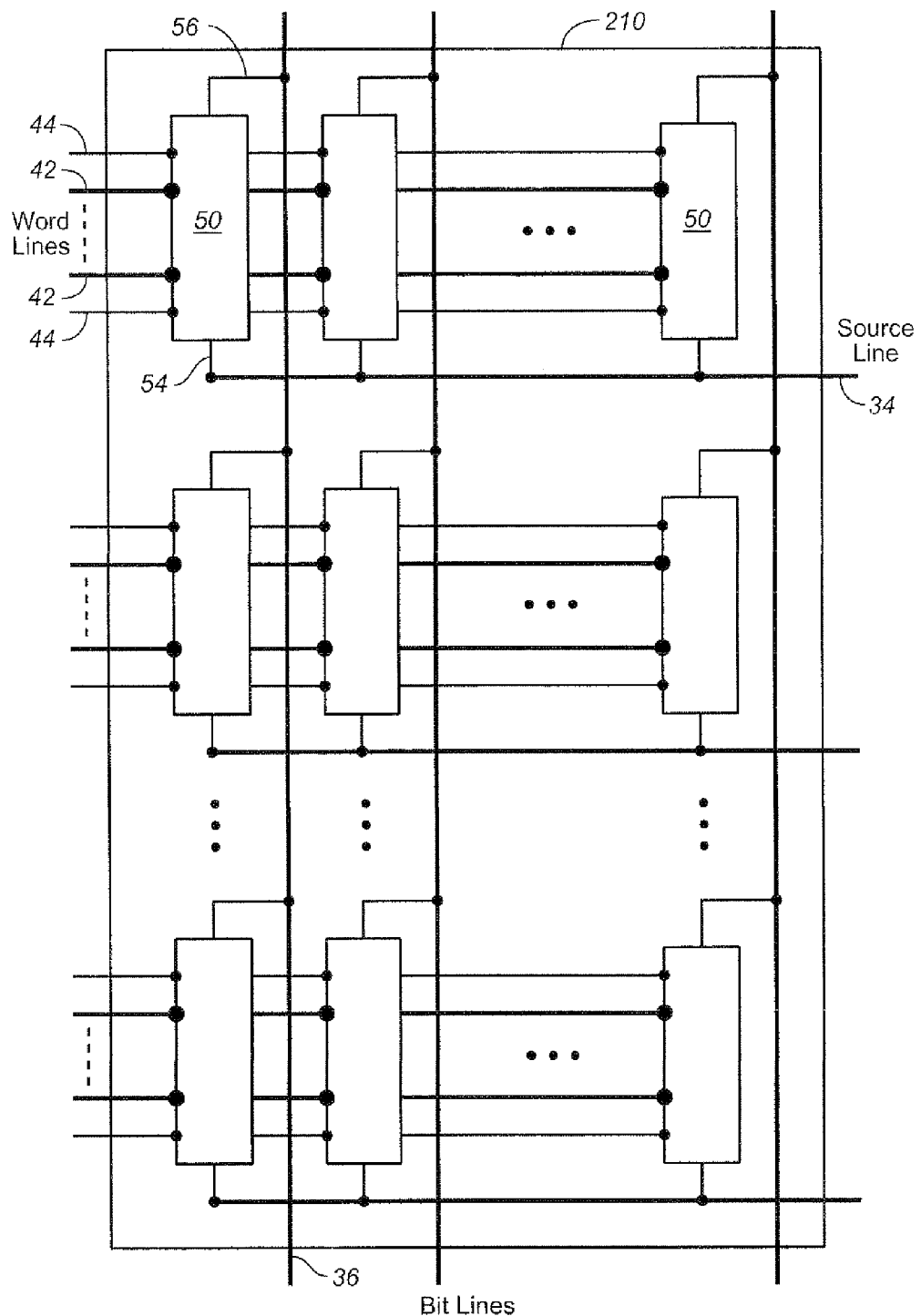
FIG. 4B illustrates an example of an NAND array 210 of memory cells, constituted from NAND strings 50 such as that shown in FIG. 4A.

FIG. 4B illustrates an example of an NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 5:
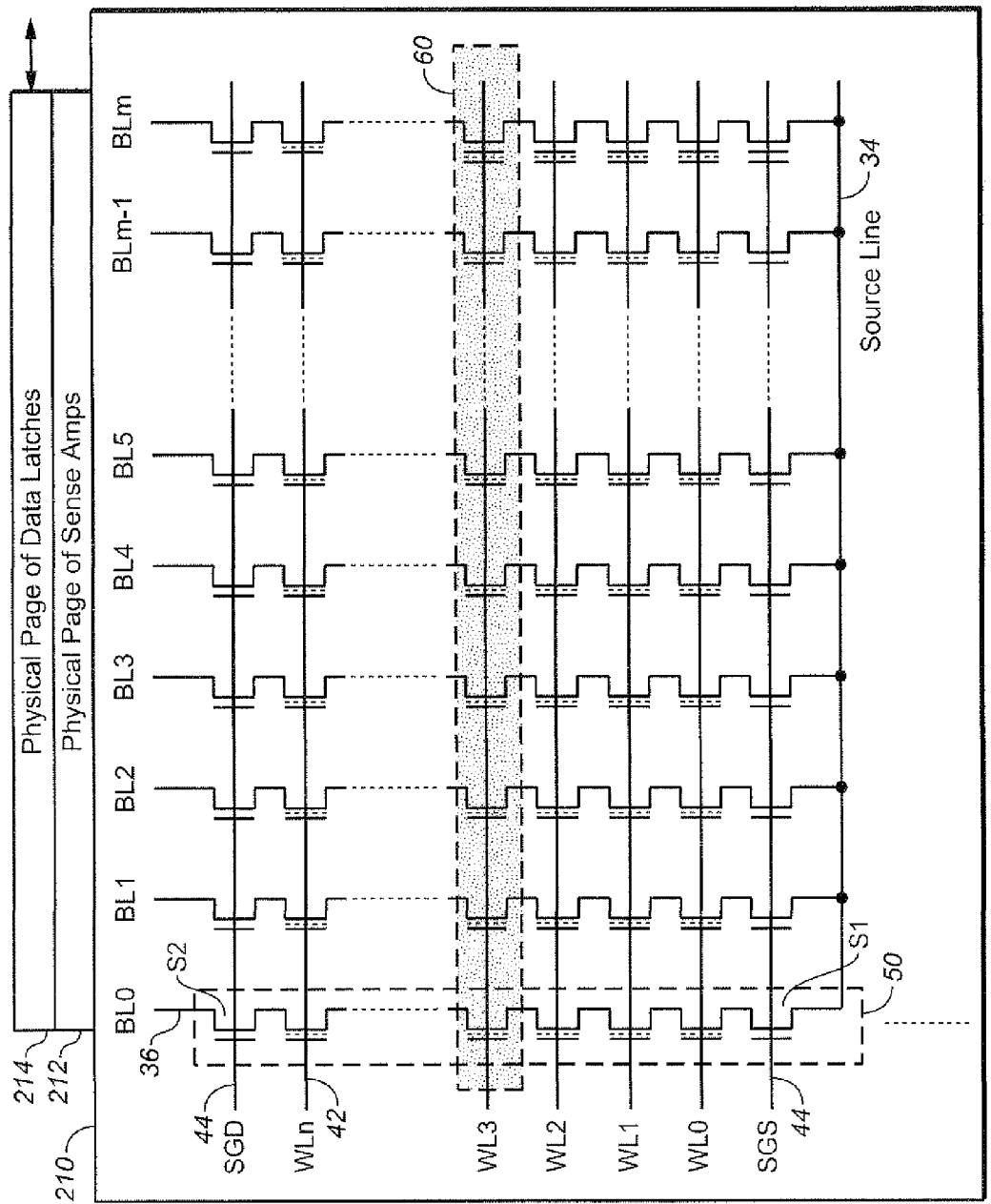
FIG. 5 illustrates a page of memory cells, organized for example in the NAND configuration, being sensed or programmed in parallel.

FIG. 5 illustrates a page of memory cells, organized for example in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A "page" such as the page 60, is a group of memory cells enabled to be sensed or programmed in parallel. This is accomplished by a corresponding page of sense amplifiers 212. The sensed results are latches in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and of type of memory is that a cell must be programmed from the erased state. That is the floating gate must first be emptied of charge. Programming then adds a desired amount of charge back to the floating gate. It does not support removing a portion of the charge from the floating to go from a more programmed state to a lesser one. This means that update data cannot overwrite existing one and must be written to a previous unwritten location.

Furthermore erasing is to empty all the charges from the floating gate and generally takes appreciably time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data. Just before the block is erased, a garbage collection is required to salvage the non-obsolete data in the block.

Each block is typically divided into a number of pages. A page is a unit of programming or reading. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Multiple blocks and pages distributed across multiple arrays can also be operated together as metablocks and metapages. If they are distributed over multiple chips, they can be operated together as megablocks and megapage.

Examples of Multi-Level Cell ("MLC") Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

All-Bit, Full-Sequence MLC Programming

Figure 6:
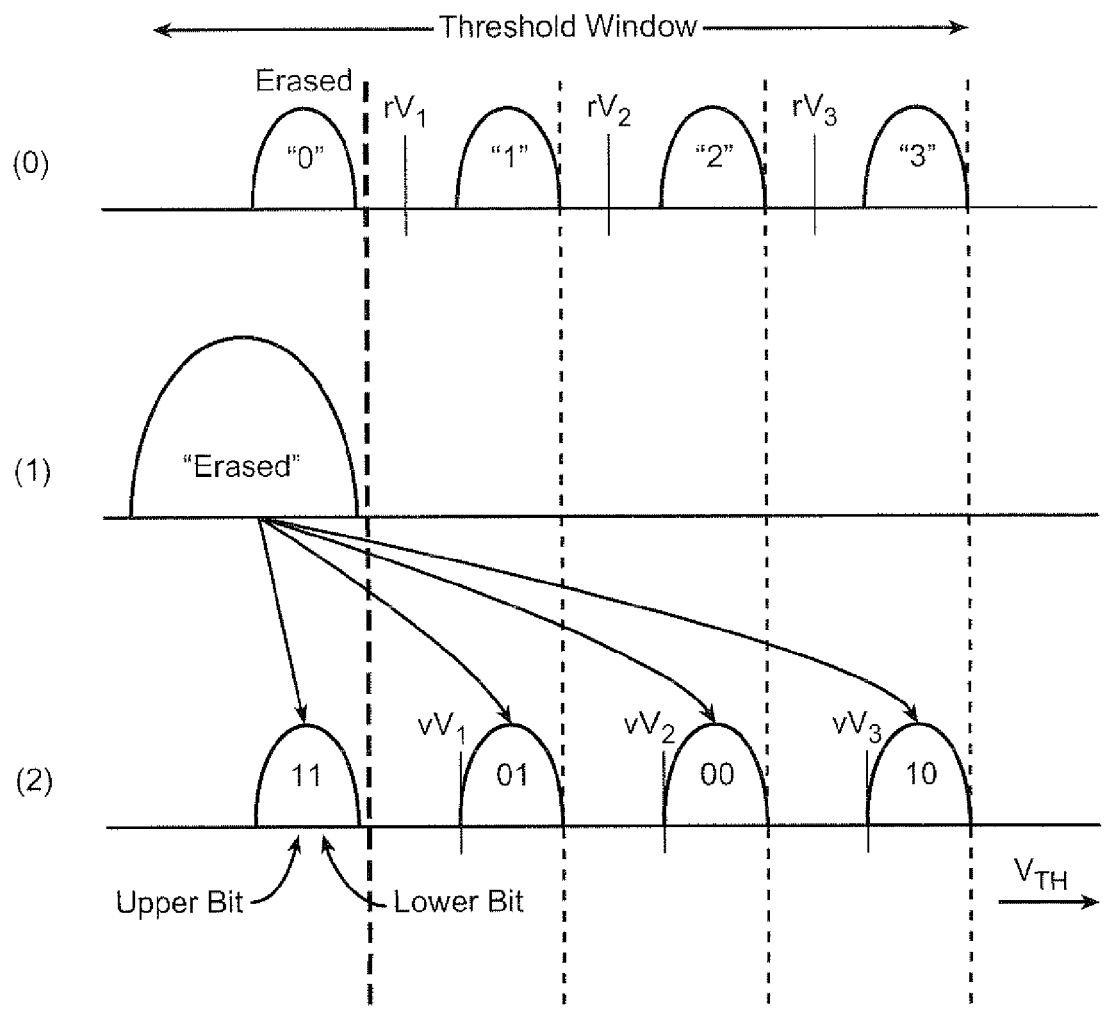
FIGS. 6(0)-6(2) illustrate an example of programming a population of 4-state memory cells.

FIGS. 6(0)-6(2) illustrate an example of programming a population of 4-state memory cells. FIG. 6(0) illustrates the population of memory cells programmable into four distinct distributions of threshold voltages respectively representing memory states "0", "1", "2" and "3". FIG. 6(1) illustrates the initial distribution of "erased" threshold voltages for an erased memory. FIG. 6(2) illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed state "1", "2" and "3" or remain un-programmed in the "erased" state. As the memory gets more programming, the initial distribution of the "erased" state as shown in. FIG. 6(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
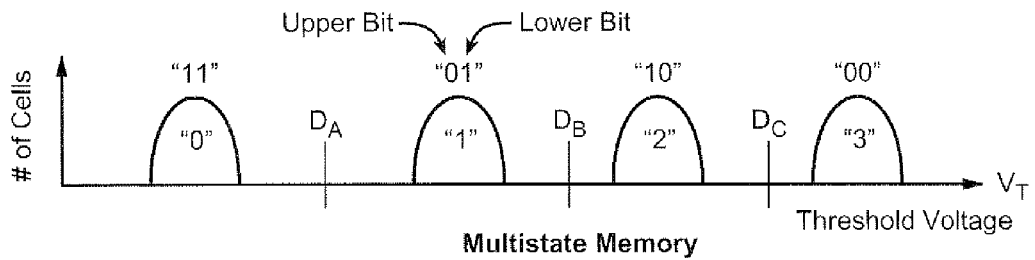
FIGS. 7A-7E illustrate the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY".

Figure 7B:
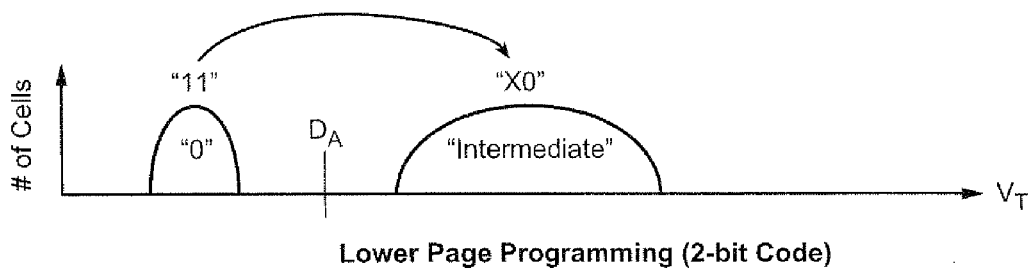

FIG. 7B illustrates the lower page programming (lower bit) in a 2-pass programming scheme using the 2-bit code. The fault-tolerant LM New code essentially avoids any upper page programming to transit through any intermediate states.

Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
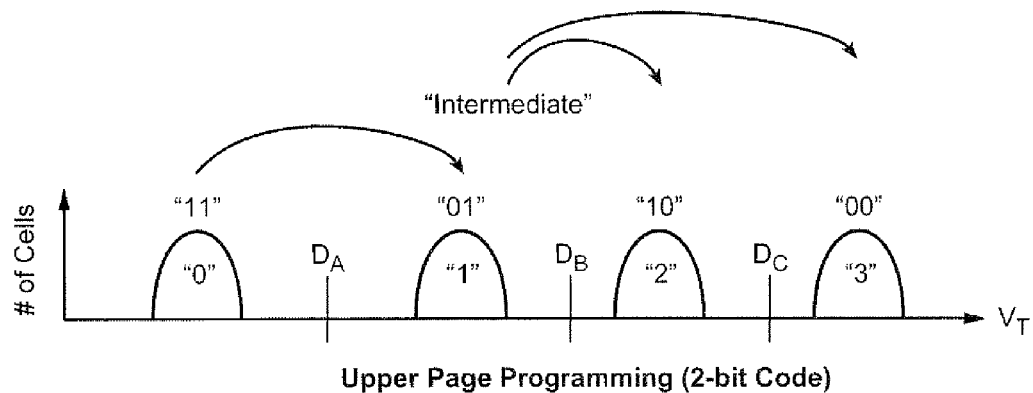

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
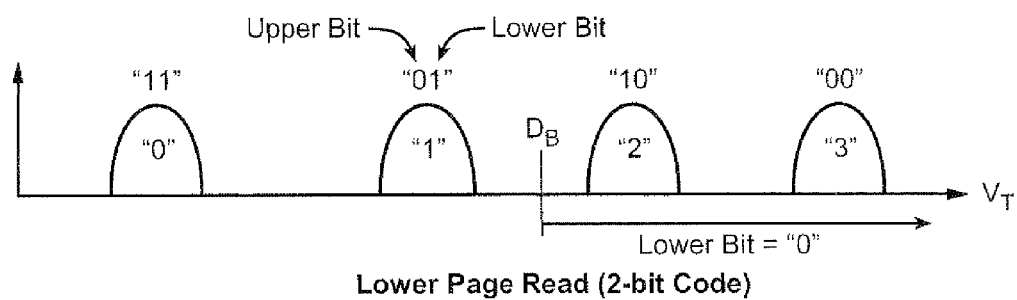

FIG. 7D illustrates the read operation that is required to discern the lower bit of the 4-state memory encoded with the 2-bit code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 7E:
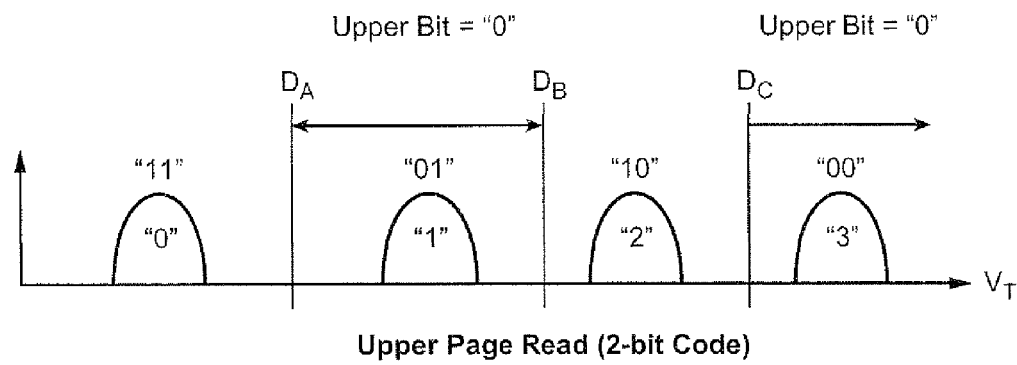

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit.

Foggy-Fine Programming

Figure 7F:
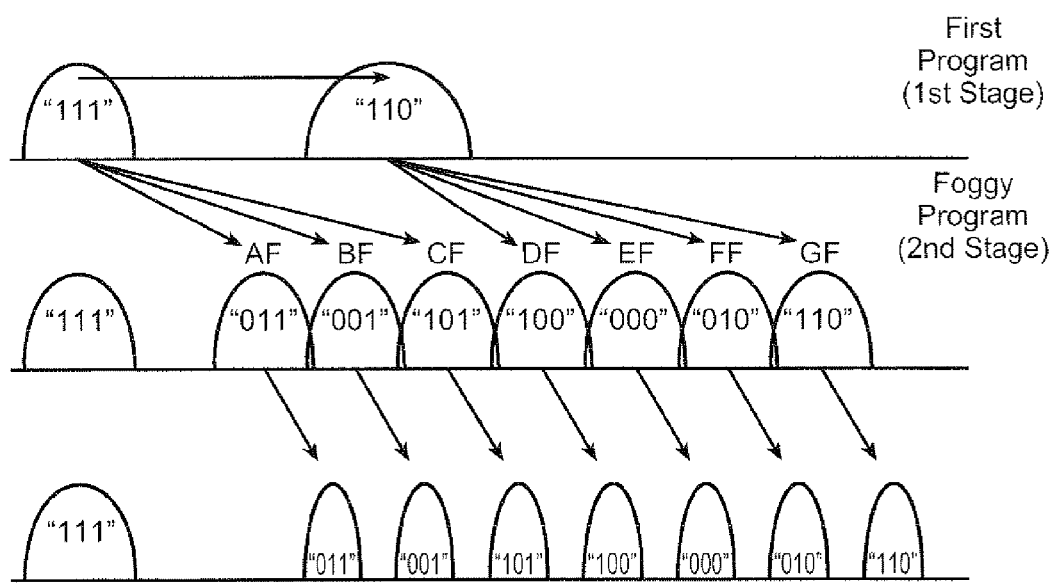
FIG. 7F illustrates a foggy-fine programming for an 8-state memory encoded with a given 3-bit code.

Another variation on multi-state programming employs a foggy-fine algorithm, as is illustrated in FIG. 7F for a 3-bit memory example. As shown there, this another multi-phase programming operation. A first programming operation is performed as shown in the top line, followed the foggy programming stage. The foggy phase is a full 3-bit programming operation from the first phase using all eight of the final states. At the end of the foggy, though, the data in these states is not yet fully resolved into well defined distributions for each of the 8 states (hence, the "foggy" name) and is not readily extractable.

As each cell is, however, programmed to near its eventual target state, the sort of neighboring cell to cell couplings, or "Yupin" effect, described in U.S. Pat. No. 6,870,768 are presenting most of their effect. Because of this, when the fine program phase (shown on the bottom line) is executed, these couplings have largely been factored in to this final phase so the cell distributions are more accurately resolved to their target ranges. More detail on these subjects is given in U.S. Pat. Nos. 6,870,768 and 6,657,891 and in the US patent application entitled "Atomic Program Sequence and Write Abort Detection" by Gorobets et al. having U.S. Pat. No. 8,054,684 and which is being filed concurrently herewith, and which presents a "diagonal" first-foggy-fine method.

Binary and MLC Memory Partitioning

FIG. 6 and FIG. 7 illustrate examples of a 2-bit (also referred to as "D2") memory. As can be seen, a D2 memory has its threshold range or window partitioned into 4 regions, designating 4 states. Similarly, in D3, each cell stores 3 bits (low, middle and upper bits) and there are 8 regions. In D4, there are 4 bits and 16 regions, etc. As the memory's finite threshold window is partitioned into more regions, the resolution and for programming and reading will necessarily become finer. Two issues arise as the memory cell is configured to store more bits.

First, programming or reading will be slower when the threshold of a cell must be more accurately programmed or read. In fact in practice the sensing time (needed in programming and reading) tends to increase as the square of the number of partitioning levels.

Secondly, flash memory has an endurance problem as it ages with use. When a cell is repeatedly programmed and erased, charges is shuttled in and out of the floating gate 20 (see FIG. 2) by tunneling across a dielectric. Each time some charges may become trapped in the dielectric and will modify the threshold of the cell. In fact over use, the threshold window will progressively narrow. Thus, MLC memory generally is designed with tradeoffs between capacity, performance and reliability.

Conversely, it will be seen for a binary memory, the memory's threshold window is only partitioned into two regions. This will allow a maximum margin of errors. Thus, binary partitioning while diminished in storage capacity will provide maximum performance and reliability.

The multi-pass, bit-by-bit programming and reading technique described in connection with FIG. 7 provides a smooth transition between MLC and binary partitioning. In this case, if the memory is programmed with only the lower bit, it is effectively a binary partitioned memory. While this approach does not fully optimize the range of the threshold window as in the case of a single-level cell ("SLC") memory, it has the advantage of using the same demarcation or sensing level as in the operations of the lower bit of the MLC memory. As will be described later, this approach allows a MLC memory to be "expropriated" for use as a binary memory, or vice versa. How it should be understood that MLC memory tends to have more stringent specification for usage.

Binary Memory and Partial Page Programming

The charge programmed into the charge storage element of one memory cell produces an electric field that perturbs the electric field of a neighboring memory cell. This will affect the characteristics of the neighboring memory cell which essentially is a field-effect transistor with a charge storage element. In particular, when sensed the memory cell will appear to have a higher threshold level (or more programmed) than when it is less perturbed.

In general, if a memory cell is program-verified under a first field environment and later is read again under a different field environment due to neighboring cells subsequently being programmed with different charges, the read accuracy may be affected due to coupling between neighboring floating gates in what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Bit-by-Bit MLC Programming technique described in connection with FIG. 7 above is designed to minimize program disturb from cells along the same word line. As can be seen from FIG. 7B, in a first of the two programming passes, the thresholds of the cells are moved at most half way up the threshold window. The effect of the first pass is overtaken by the final pass. In the final pass, the thresholds are only moved a quarter of the way. In other words, for D2, the charge difference among neighboring cells is limited to a quarter of its maximum. For D3, with three passes, the final pass will limit the charge difference to one-eighth of its maximum.

However, the bit-by-bit multi-pass programming technique will be compromised by partial-page programming. A page is a group of memory cells, typically along a row or word line, that is programmed together as a unit. It is possible to program non overlapping portions of a page individually over multiple programming passes. However, owning to not all the cells of the page are programmed in a final pass together, it could create large difference in charges programmed among the cells after the page is done. Thus partial-page programming would result in more program disturb and would require a larger margin for sensing accuracy.

In the case the memory is configured as binary memory, the margin of operation is wider than that of MLC. In the preferred embodiment, the binary memory is configured to support partial-page programming in which non-overlapping portions of a page may be programmed individually in one of the multiple programming passes on the page. The programming and reading performance can be improved by operating with a page of large size. However, when the page size is much larger than the host's unit of write (typically a 512-byte sector), its usage will be inefficient. Operating with finer granularity than a page allows more efficient usage of such a page.

The example given has been between binary versus MLC. It should be understood that in general the same principles apply between a first memory with a first number of levels and a second memory with a second number of levels more than the first memory.

Logical and Physical Block Structures

Figure 8:
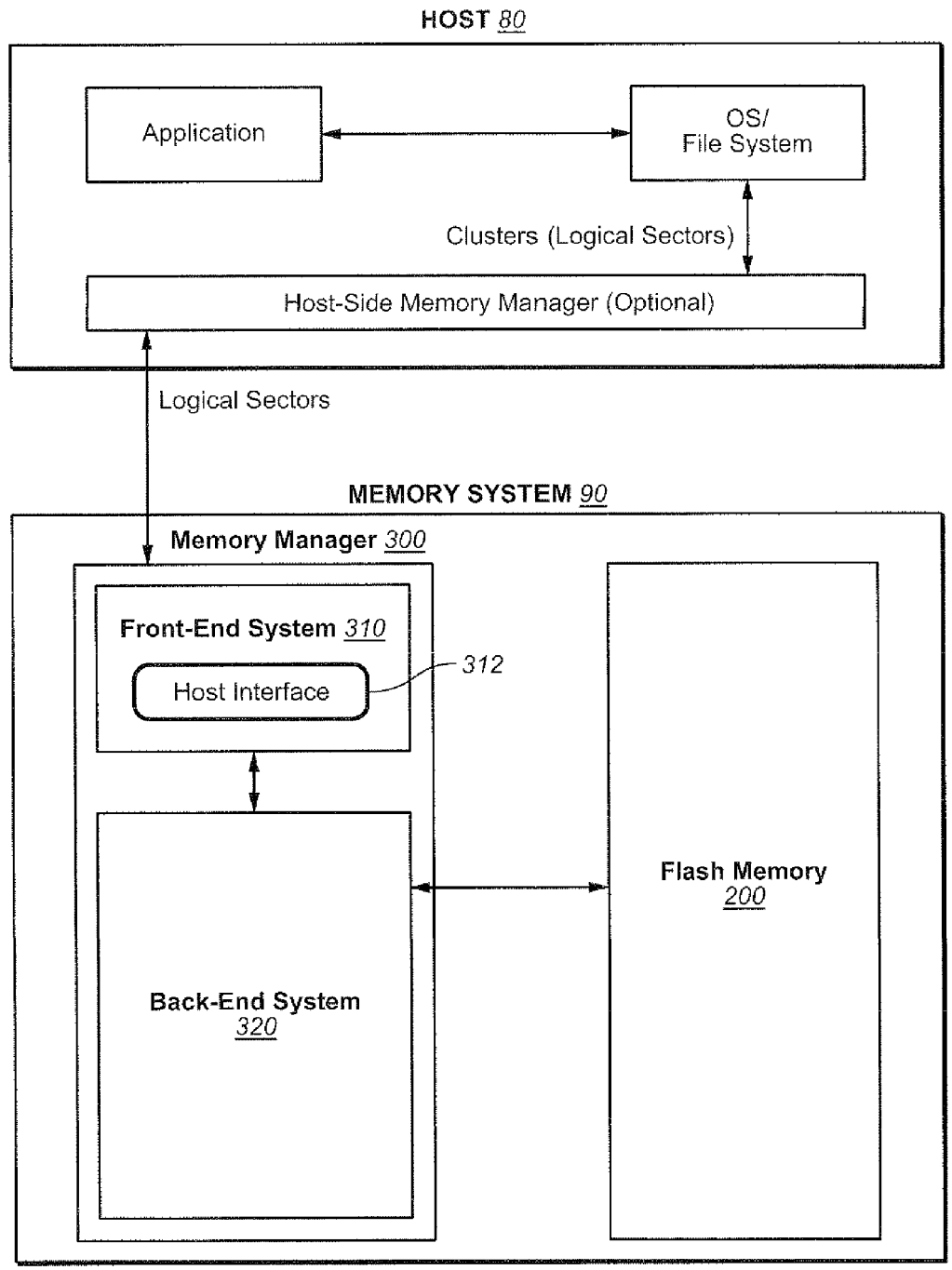
FIG. 8 illustrates the memory being managed by a memory manager with is a software component that resides in the controller.

FIG. 8 illustrates the memory being managed by a memory manager with is a software component that resides in the controller. The memory 200 is organized into blocks, each block of cells being a minimum unit of erase. Depending on implementation, the memory system may operate with even large units of erase formed by an aggregate of blocks into "metablocks" and also "megablocks". For convenience the description will refer to a unit of erase as a metablock although it will be understood that some systems operate with even larger unit of erase such as a "megablock" formed by an aggregate of metablocks.

The host 80 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 80 essentially issues a command to the memory system 90 to read or write a segment containing a string of logical sectors of data with contiguous addresses.

A memory-side memory manager 300 is implemented in the controller 100 of the memory system 90 to manage the storage and retrieval of the data of host logical sectors among metablocks of the flash memory 200. The memory manager comprises a front-end system 310 and a back-end system 320. The front-end system 310 includes a host interface 312. The back-end system 320 includes a number of software modules for managing erase, read and write operations of the metablocks. The memory manager also maintains system control data and directory data associated with its operations among the flash memory 200 and the controller RAM 130.

Figure 9:
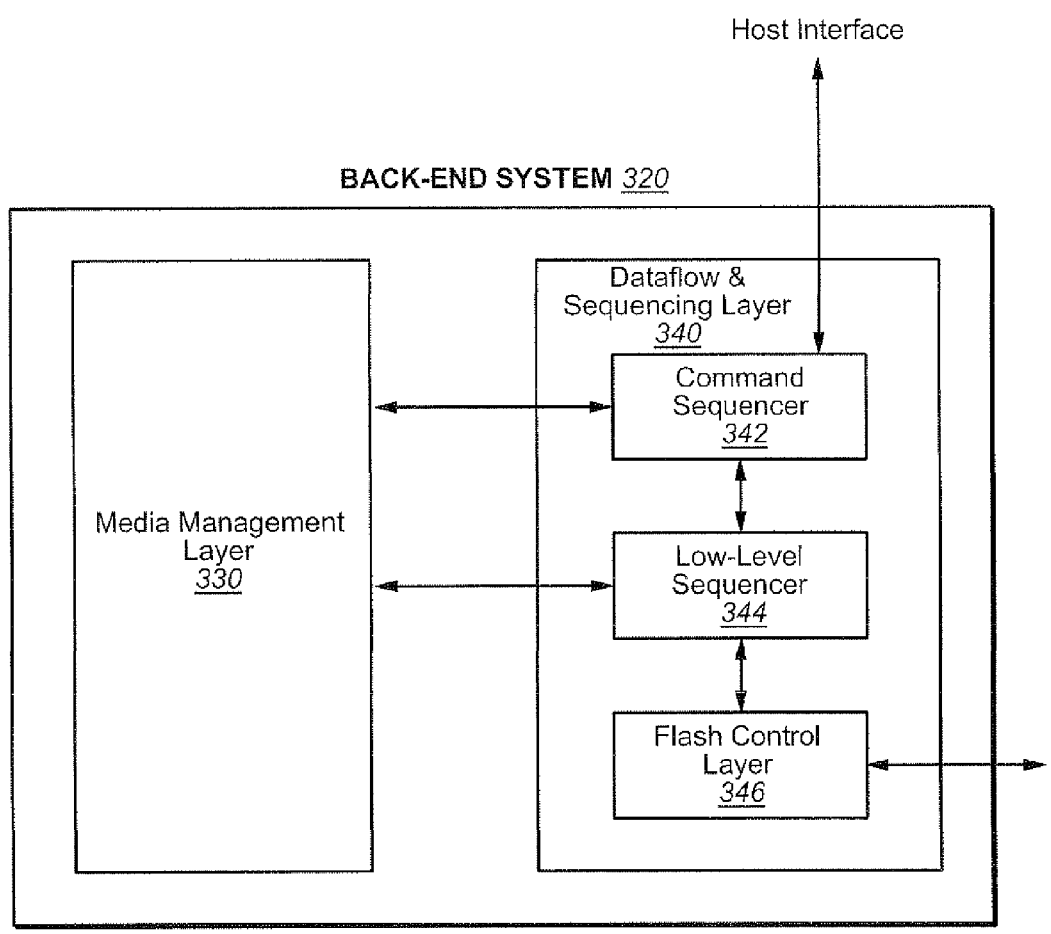
FIG. 9 illustrates the software modules of the back-end system.

FIG. 9 illustrates the software modules of the back-end system. The Back-End System mainly comprises two functional modules: a Media Management Layer 330 and a Dataflow and Sequencing Layer 340.

The media management layer 330 is responsible for the organization of logical data storage within a flash memory meta-block structure. More details will be provided later in the section on "Media management Layer".

The dataflow and sequencing layer 340 is responsible for the sequencing and transfer of sectors of data between a front-end system and a flash memory. This layer includes a command sequencer 342, a low-level sequencer 344 and a flash Control layer 346. More details will be provided later in the section on "Low Level System Spec".

The memory manager 300 is preferably implemented in the controller 100. It translates logical addresses received from the host into physical addresses within the memory array, where the data are actually stored, and then keeps track of these address translations.

Figure 10A:
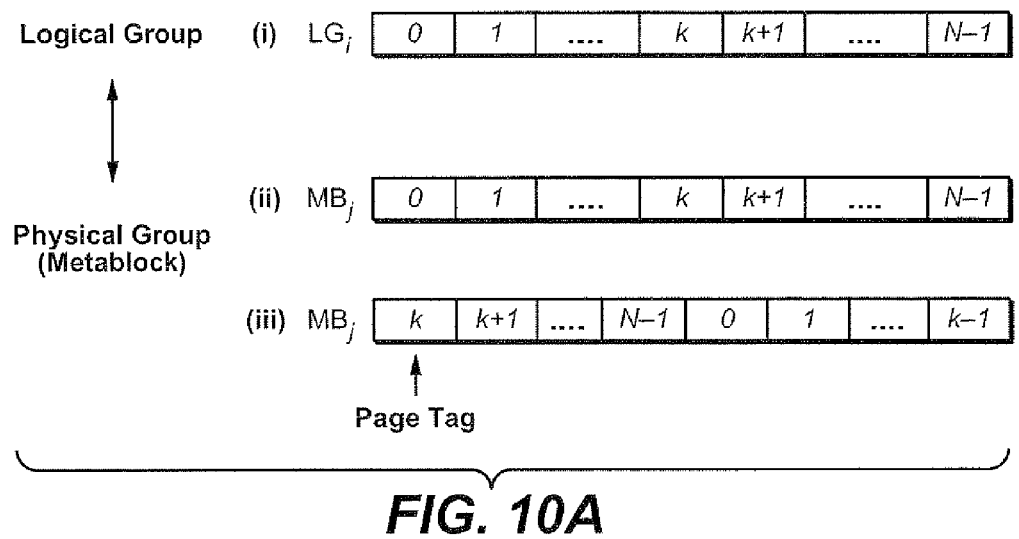
FIGS. 10A(i)-10A(iii) illustrate schematically the mapping between a logical group and a metablock.

FIGS. 10A(i)-10A(iii) illustrate schematically the mapping between a logical group and a metablock. The metablock of the physical memory has N physical sectors for storing N logical sectors of data of a logical group. FIG. 10A(i) shows the data from a logical group $LG_i$, where the logical sectors are in contiguous logical order 0, 1, . . . , N−1. FIG. 10A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 10A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 10B:
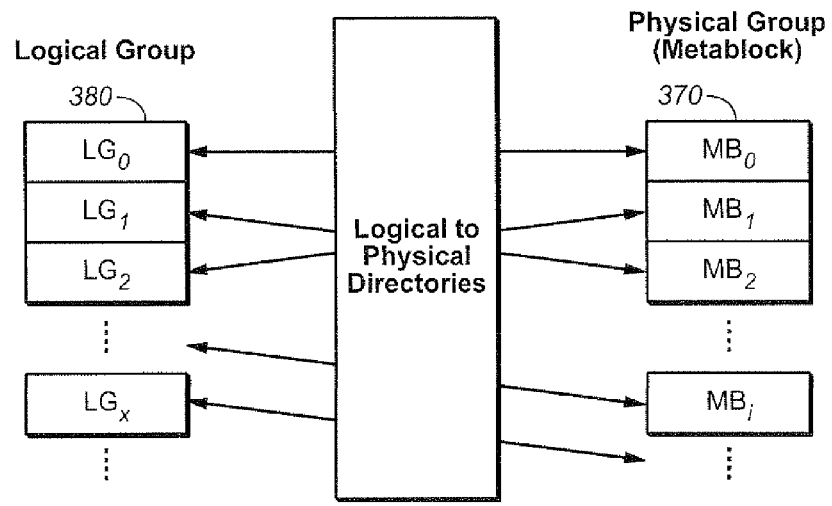
FIG. 10B illustrates schematically the mapping between logical groups and metablocks.

FIG. 10B illustrates schematically the mapping between logical groups and metablocks. Each logical group 380 is mapped to a unique metablock 370, except for a small number of logical groups in which data is currently being updated. After a logical group has been updated, it may be mapped to a different metablock. The mapping information is maintained in a set of logical to physical directories, which will be described in more detail later.

Memories Having Multi-Level and Binary Portions

Memory Partitioned into Main and Binary Cache Portions

A number of memory system arrangements where the non-volatile memory includes both binary and multi-level sections will now be described. In a first of these, in a flash memory having an array of memory cells that are organized into a plurality of blocks, the cells in each block being erased together, the flash memory is partitioned into at least two portions. A first portion forms the main memory for storing mainly user data. Individual memory cells in the main memory being configured to store one or more bits of data in each cell. A second portion forms a cache for data to be written to the main memory. The memory cells in the cache portion are configured to store less bits of data in each cell than that of the main memory. Both the cache portion and the main memory portion operate under a block management system for which cache operation is optimized. A more detailed presentation of this material is developed in the following US patent application or provisional application numbers: Ser. Nos. 12/348,819; 12/348,825; 12/348,891; 12/348, 895; 12/348,899; and 61/142,620, all filed on Jan. 5, 2009

In the preferred embodiment, individual cells in the cache portion are each configured to store one bit of data while the cells in the main memory portion each stares more than one bit of data. The cache portion then operates as a binary cache with faster and more robust write and read performances.

In the preferred embodiment, the cache portion is configured to allow finer granularity of writes than that for the main memory portion. The finer granularity is more compatible with the granularity of logical data units from a host write. Due to requirement to store sequentially the logical data units in the blocks of the main memory, smaller and chaotic fragments of logical units from a series of host writes can be buffered in the cache portion and later reassembly in sequential order to the blocks in the main memory portion.

In one aspect of the invention, the decision for the block management system to write data directly to the main portion or to the cache portion depends on a number of predefined conditions. The predefined conditions include the attributes and characteristics of the data to be written, the state of the blocks in the main memory portion and the state of the blocks in the cache portion.

The Binary Cache of the present system has the follows features and advantages: a) it increases burst write speed to the device; b) it allows data that is not aligned to pages or meta-pages to be efficiently written; c) it accumulates data for a logical group, to minimize the amount of data that must be relocated during garbage collection of a meta-block after the data has been archived to the meta-block; d) it stores data for a logical group in which frequent repeated writes occur, to avoid writing data for this logical group to the meta-block; and e) it buffers host data, to allow garbage collection of the meta-block to be distributed amongst multiple host busy periods.

Figure 11:
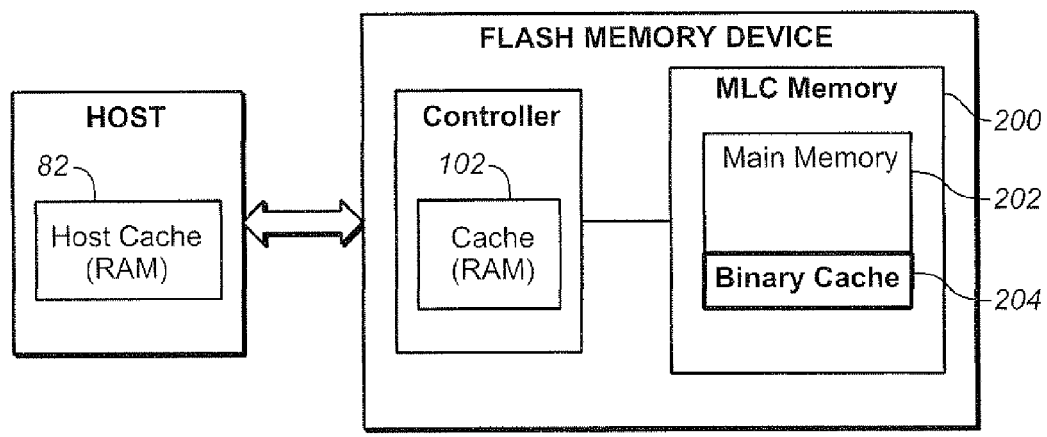
FIG. 11 illustrates a host operating with the flash memory device through a series of caches at different levels of the system.

FIG. 11 illustrates a host operating with the flash memory device through a series of caches at different levels of the system. A Cache is high-speed storage for temporarily storing data being passed between a high-speed and a slower-speed component of the system. Typically high-speed volatile RAM are employed as cache as in a host cache 82 and/or in a controller cache 102 of the memory controller. The non-volatile memory 200 is partitioned into two portions. The first portion 202 has the memory cells operating as a main memory for user data in either MLC or binary mode. The second portion 204 has the memory cells operating as a cache in a binary mode. Thus, the memory 200 is partitioned into a main memory 202 and a binary cache.

On-Memory Folding of Data into Multi-State Format

The various sorts of non-volatile memories described above can be operated in both binary forms and multi-state (or multi-level) forms. Some memory systems store data in both binary and multi-state formats; for example, as data can typically be written more quickly and with less critical tolerances in binary form, a memory may initial write data in binary form as it is received from a host and later rewrite this data in a multi-state format for greater storage density. In such memories, some cells may be used in binary format with others used in multi-state format, or the same cells may be operated to store differing numbers of bits. Examples of such systems are discussed in more detail in U.S. Pat. No. 6,456,528; US patent publication number 2009/0089481; and the following US patent application numbers: 61/142,620; Ser. Nos. 12/348, 819; 12/348,825; 12/348,891; 12/348,895; and 12/348,899. The techniques described in this section relate to rewriting data from a binary format into a multi-state format in a "folding" process executed on the memory device itself, without the requirement of transferring the data back to the controller for reformatting. The on-memory folding process can also be used in a special way to manage error correction code (ECC) where the relative state of the data in the memory cell, when stored in multi-state form, is taken into account when considering that the most probable errors are transitions between the neighboring states. (So called "Strong ECC" or "SECC", where additional background detail on these subjects can be found in the following US patents, patent publications, and patent application numbers: 2009/0094482; U.S. Pat. No. 7,502,254; 2007/0268745; 2007/0283081; U.S. Pat. Nos. 7,310,347; 7,493,457; 7,426,623; 2007/0220197; 2007/0065119; 2007/0061502; 2007/0091677; 2007/0180346; 2008/0181000; 2007/0260808; 2005/0213393; 6,510,488; 7,058,818; 2008/0244338; 2008/0244367; 2008/0250300; and 2008/0104312.) The system can also use ECC management which does not consider state information and manages ECC based on single page information.

More specifically, in one exemplary embodiment, as data is transferred from the controller to the memory, it is written along word lines of the memory array in a binary format. Subsequently, the data is then read into the registers associated with the array, where it is rearranged so that it can be written back into array in a multi-state form. To take the case of three bits per cell, for example, the content of three word lines would be each be read into the register structures, rearranged to correspond to the three bits that would be stored in each cell, and then rewritten back to a single word line of the array in a 3-bit per cell format. In the arrangement described here, the binary data content of a single word line is then end up on 1/Nth of a word line store in an N-bit per cell format. For cases where the eventual N-bit storage of the data uses an error correction code (ECC) that exploits the relation of the multi-states with a cell, this ECC can be determined in the controller and transferred along with the corresponding data and stored in the binary format prior to the data (and corresponding ECC) being rewritten in the multi-state format.

Figure 12:
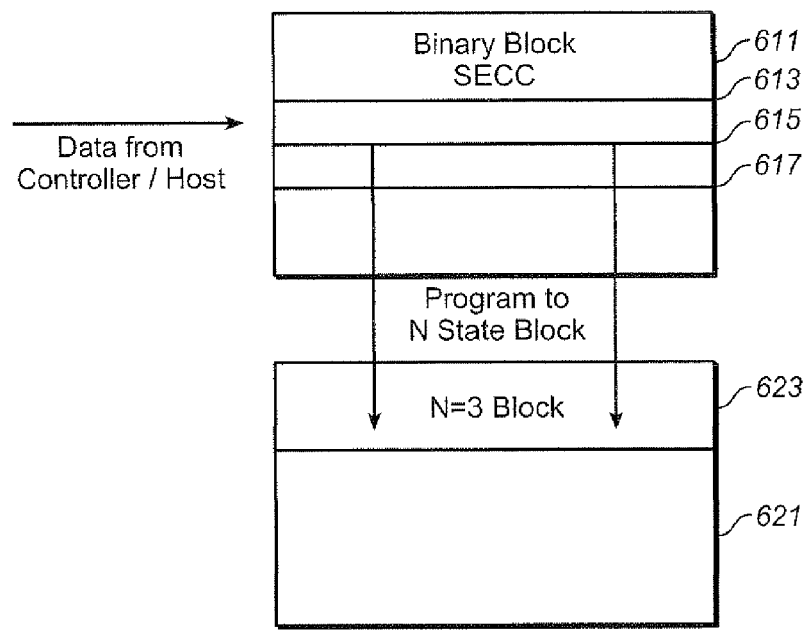
FIG. 12 outlines the on-memory folding process where the data from multiple word lines written in a binary format are rewritten into a multi-state format.

The idea of folding data from a binary to a multi-state, or MLC, format can be illustrated with FIG. 12 for one particular 3-bit per cell example. As shown by the arrow, data is received from the controller (or host) and written in binary format in a block 611 of the memory. Three of the written word lines (613, 615, 617) of the block 611 are explicitly shown. The content of these three word lines are then rewritten in a 3-bit per cell format along the single word line 623 of block 621, with the "folding" process accomplished on the memory itself. (More generally, if the data is written along 621 in an N-bit per cell format, the content of N-word lines of binary content would be folded up in this manner. This block 611 may specifically assigned to be operated in only binary mode or may be a block operable in a MLC mode by, for example, just the lowest page of multiple logical pages storable on a physical page. Similarly, block 621 may be assigned only for multi-state operation or may be operable in binary mode as well.

Figure 13:
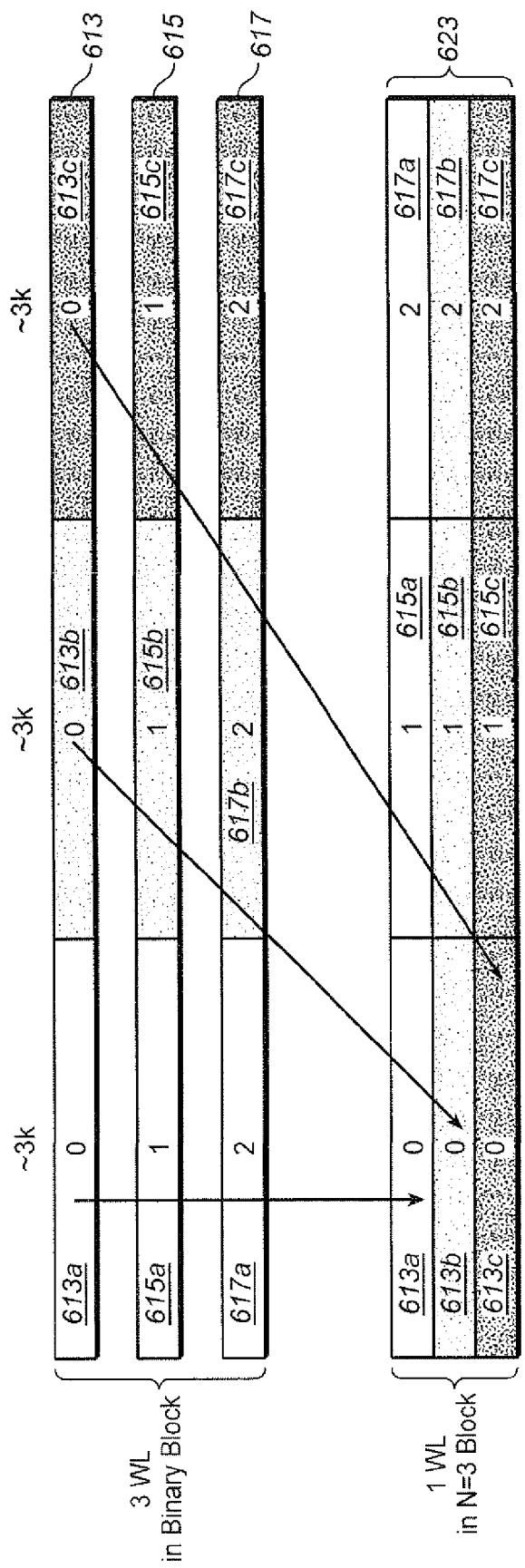
FIG. 13 illustrates aspects of the folding process in more detail.

Some detail on how one exemplary embodiment folds the data from the multiple binary format word lines into a single word line is shown in FIG. 13. At the top of FIG. 13 are the three word lines 613, 615, and 617, which are each split into three parts (a, b, c) of a third of the cells along a corresponding third of the bit lines (here taken as contiguous). On word line 623, the three thirds of the first word line (613*a-c*) are arranged onto to first third of the of the word line; similarly, the second binary word line 615 is folded and written into the middle third of 623 and the third word line from the binary block 617 is written into the last third of 623.

The process shown in FIG. 13 generalizes in a number of ways. A first of these is in the number of states stored per cell in the multi-state format. Although FIGS. 12 and 13 show the case where three pages of data are rewritten from three physical pages into multi-state format on a single physical page, other numbers of storage densities can be used. (For example, to simplify the following discussion, particularly that related to the register structure, the 2-bit per cell case will often be used as the exemplary embodiment.) Also, although full word lines (each here corresponding to a page) are shown, in system that allow partial page operation, partial pages may be used. Additionally, although FIG. 13 shows the case where cells along the word line are split into groups along contiguous bit lines for folding, other arrangements can be used. In the following sections, "folding" will generally refer to the sort of process where data is read from several locations in the binary section into the data read/write registers and then re-written into multi-state form in the MLC memory section, most easily visualized for the example of reading out N binary word lines and re-writing them on a single word line in N-bit per cell format; and although the folding can involve the sort of on-chip transpositions illustrated with respect to FIG. 13, more generally it may also be the more straight forward direct copy type of folding.

As noted above, the folding process is performed on the memory itself, so that once the data is transferred in from the controller (or host) and written in binary format, it is rewritten into the array without transferring it off the memory. The exemplary embodiments accomplish this by reading the data of the multiple binary word lines (e.g., 613, 615, 617) into the corresponding registers (or latches) associated with the array, rearranged within these registers into the form needed for multi-state programming, and then rewritten into a single word line (e.g., 623) of a multi-state block. Thus, under the arrangement of FIG. 13, the binary content of several (here 3) cells on the same word line, but along different bit lines, are read into the associated data registers, and then rearranged to correspond to the multi-bits of a single cell on a corresponding single bit line, from where it can be written.

Although this folding has here been described as folding N logical pages of data from N physical pages of binary memory to one physical page of N-bit per cell memory. (Here, the physical page is taken as a whole word line.) More generally, the logical data can be scattered in any fashion between physical pages. In this sense, it is not a direct 3-page to single page mapping, but is more of a mapping with 3-to-1 ratio. More detail on on-chip data folding is given in U.S. application Ser. No. 12/478,997 filed on Jun. 5, 2009. Further detail and structures useful for folding as also presented in U.S. application Ser. No. 12/478,997 filed on Jun. 5, 2009.

Binary/Multi-State Memory Using Folding

Figure 14:
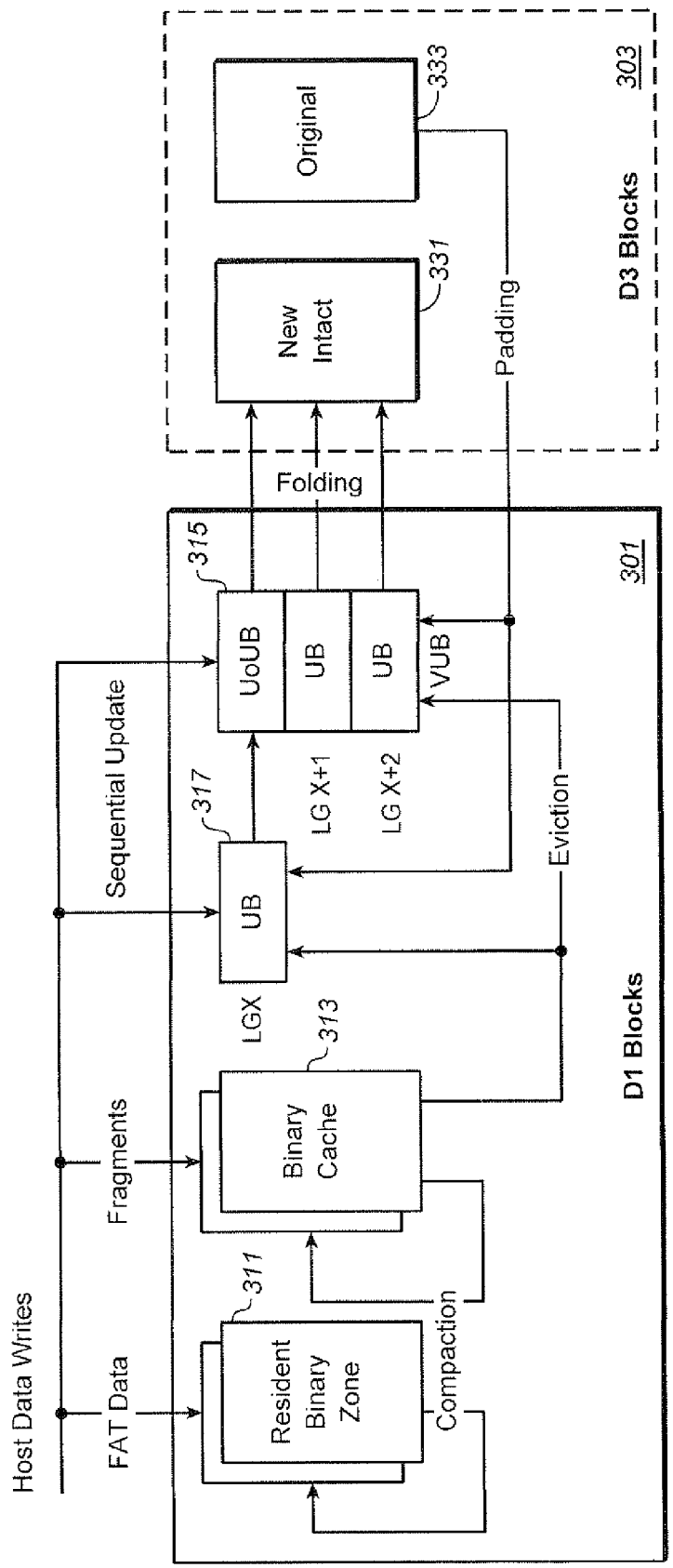
FIG. 14 shows another example of a non-volatile memory that includes both binary and multi-state memory portions.

FIG. 14 shows another example of a non-volatile memory that includes both binary and multi-state memory portions. The binary part of the memory, D1 blocks 301, includes both control data, such as file access tables (FAT), in the resident binary zone 311 and a binary cache area 313. For this discussion, these areas can be taken to be similar to those described above in the Binary Cache section above and the references cited therein. These areas are updated and compacted within themselves and do not enter further into this section. The memory also includes the multi-state (3-bit in this example) memory portion of D3 blocks 303. The D1 and D3 blocks 301 and 303 can be distributes across various semi-autonomous arrays (i.e., dies or planes within a die). (More generally, the distinction between where the updates may be stored in memory and the "bulk" storage need not be based on, or at least not characterized in terms of, binary versus multi-level, but could also be slow versus fast, relatively high endurance versus lower endurance, small block structure versus large block, or other qualitative property.)

In the exemplary embodiment, data is first written to the binary block 301 and then folded into D3 blocks. For example, once three 3 pages are written into the binary memory, then can then be folded into a single page in D3 memory 303 or follow the sort of diagonal lower-foggy-fine programming method described in "Atomic Program Sequence and Write Abort Detection" by Gorobets et al. having U.S. Pat. No. 8,054,684 and which is being filed concurrently herewith. In the on-chip folding embodiment, the binary and MLC portions will be from different blocks formed along the same bit lines. More generally, other rewrite techniques can be used. Although in some embodiments data may written directly to multi-state memory, under this arrangement discussed here user data is first written from the volatile RAM into binary memory and then "triplets" (for the D3 example) of pages, such as in 315 for the logical groups X, X+1 and X+2, that are then combined and stored in a multi-state format as a "newly intact" physical page 331, where it is stored along with other such previously written "original" pages 333. When data of one of the pages stored in a D3 block is updated, rather than store the updated data in a D3 block, this can, at least initially, stored in a binary block Update Block, or UB, 317, as is described in the next section.

Virtual Update Blocks

When updating data for some data already stored in the D3 memory, if this data is updated in the D3, this would require a multi-state rewrite using, for example, the exemplary diagonal first-foggy-fine method. Such a programming can require the buffering of data for 3 or more word lines until the data is fully written, possibly including the non-updated old data stored in MLC form on the same word line as the date to be updated. In addition to speed considerations and the memory wear this can introduce, in the case power loss or power cycle, all data for partially programmed word-lines can be lost. In the aspects presented here, the updated data is initially written to binary memory as an update block (UB) logically associated with the corresponding page of data in the MLC memory section. The updated data can itself be further updated in another binary block (an update of an update block, UoUB). If needed, the updates can then be consolidated and folded into a D3 block. A "virtual update block", or "VUB", will then consist of three full update blocks (or, more generally, on large logical group according the structure used in the system). Such a VUB will then be the update block for a D3 block, where the "virtual" referring to that it consists of three update blocks.

In one set of preferred embodiments, the architecture features Update Blocks that consist of three D1/Binary blocks where a full image of all data to be programmed to D3 block is created prior to a folding operation of copying data from the D1 blocks to a D3 block using, for example, a foggy-fine programming operation. Referring again to FIG. 14, this illustrates data flow in the system, with respect to which an exemplary embodiment is now described in more detail.

D3 blocks are written by the operation of folding, or copying of the entire Logical Group triplet, or set of 3 adjacent Logical Groups, from single, fully written closed Virtual Update Block, or set of three D1 blocks containing data for the Logical Group triplet, one each. In other words, all Logical Groups in the triplet will be fully consolidated to Virtual Update Blocks in D1 memory 301 before folding to D3 memory 303. (In other embodiments, D3 blocks can be programmed with new data without being written to a virtual update block in D1, but that is not preferred here as it requires a large data buffer where data will be vulnerable in case of power loss.)

Figure 15:
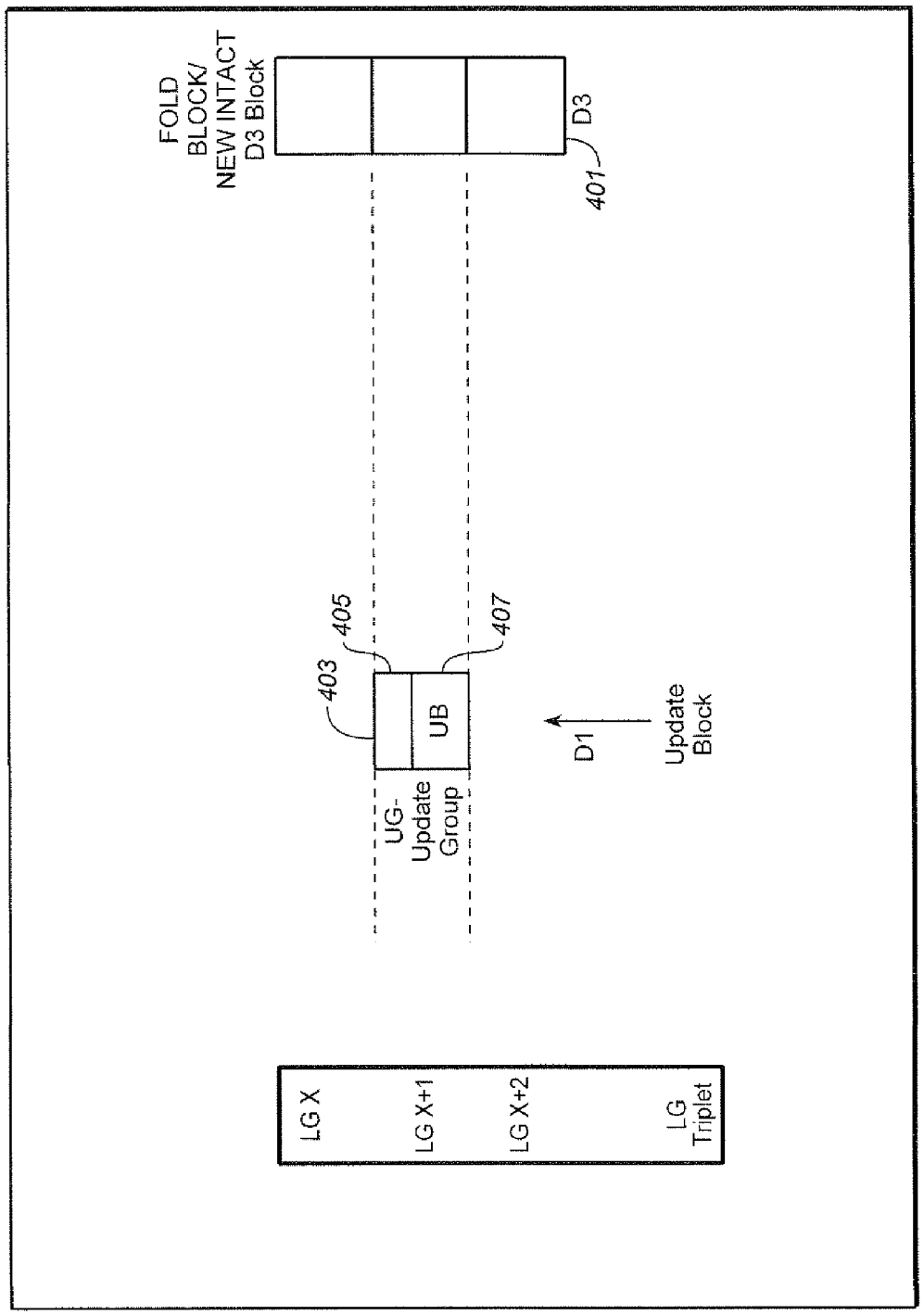
FIGS. 15-18 illustrate the use of a virtual update block.

The Logical Group needs to be consolidated together into the last Update block with ECC check upon read from flash sources and ECC correction if necessary. The D1 Update blocks can be allocated and used in much the same way as Update blocks are used in the references cited above in the "Memory Partitioned into Main and Binary Cache Portions" section above, storing data for one Logical Group each. FIG. 15 illustrates an update group with one update block. For one of the logical groups in the D3 block 401, here the "middle" one, updated data comes in and is stored in the D1 block 403. The shaded portion 405 corresponds to this updated data, with 407 the unused portion. Prior to the updated data being stored in the update block 403, this block 403 need not be previously associated with the D3 block 401, but being assigned and logically associated as needed.

Figure 16:
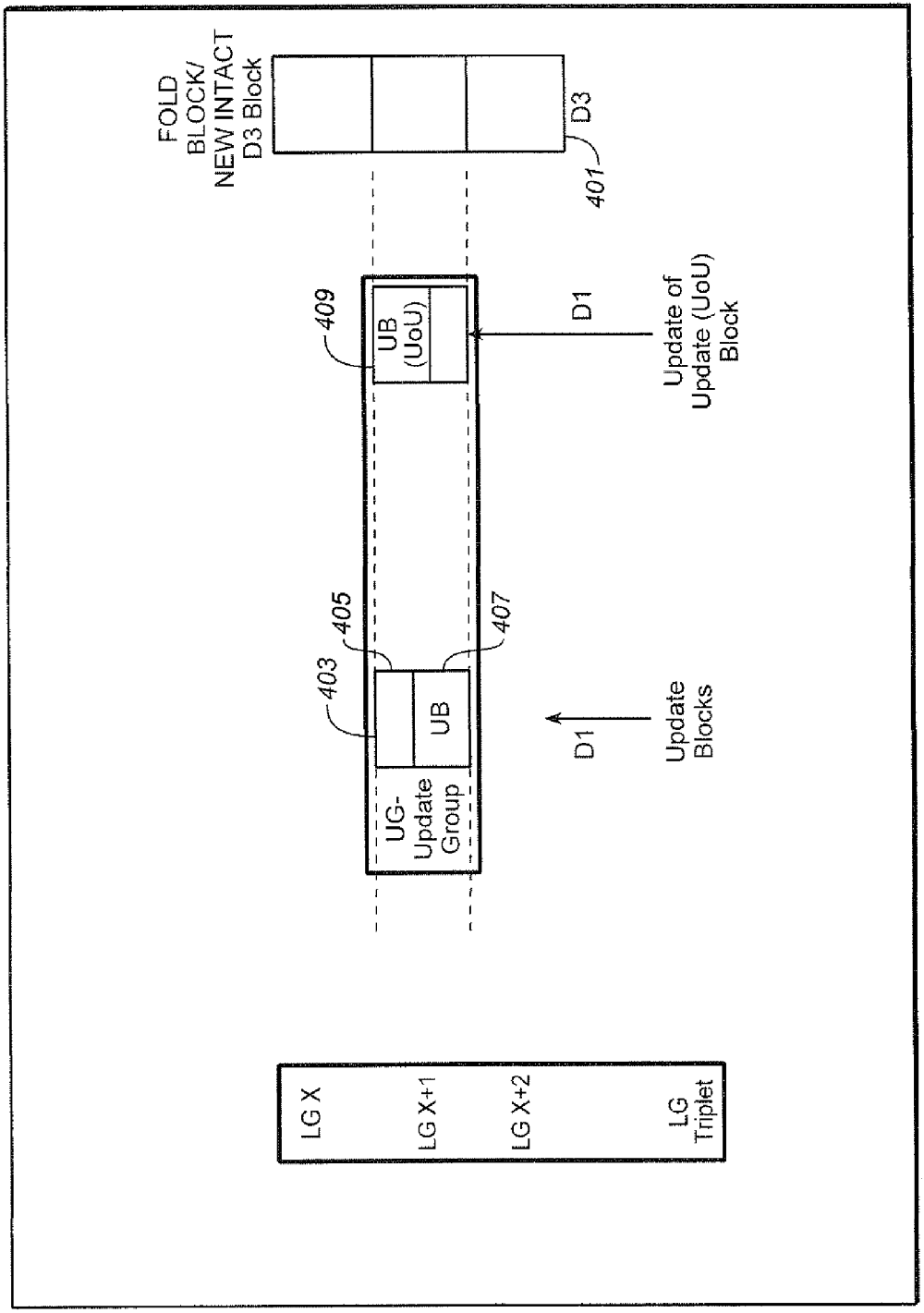

In this way, D1 meta-blocks can be allocated to Update Groups (UGs). Multiple D1 metablocks can be allocated to an UG as per the Update of Update mechanism shown FIG. 16. Subsequent to the initial update of the data, which is stored in D1 block 403, a further update of the data set comes in from the host. Another D1 block 409 is then assigned for this update of the update (UoU), which can include updated data for the earlier update 405 as well as for parts of this logical group that were not updated in the first update.

Figure 17:
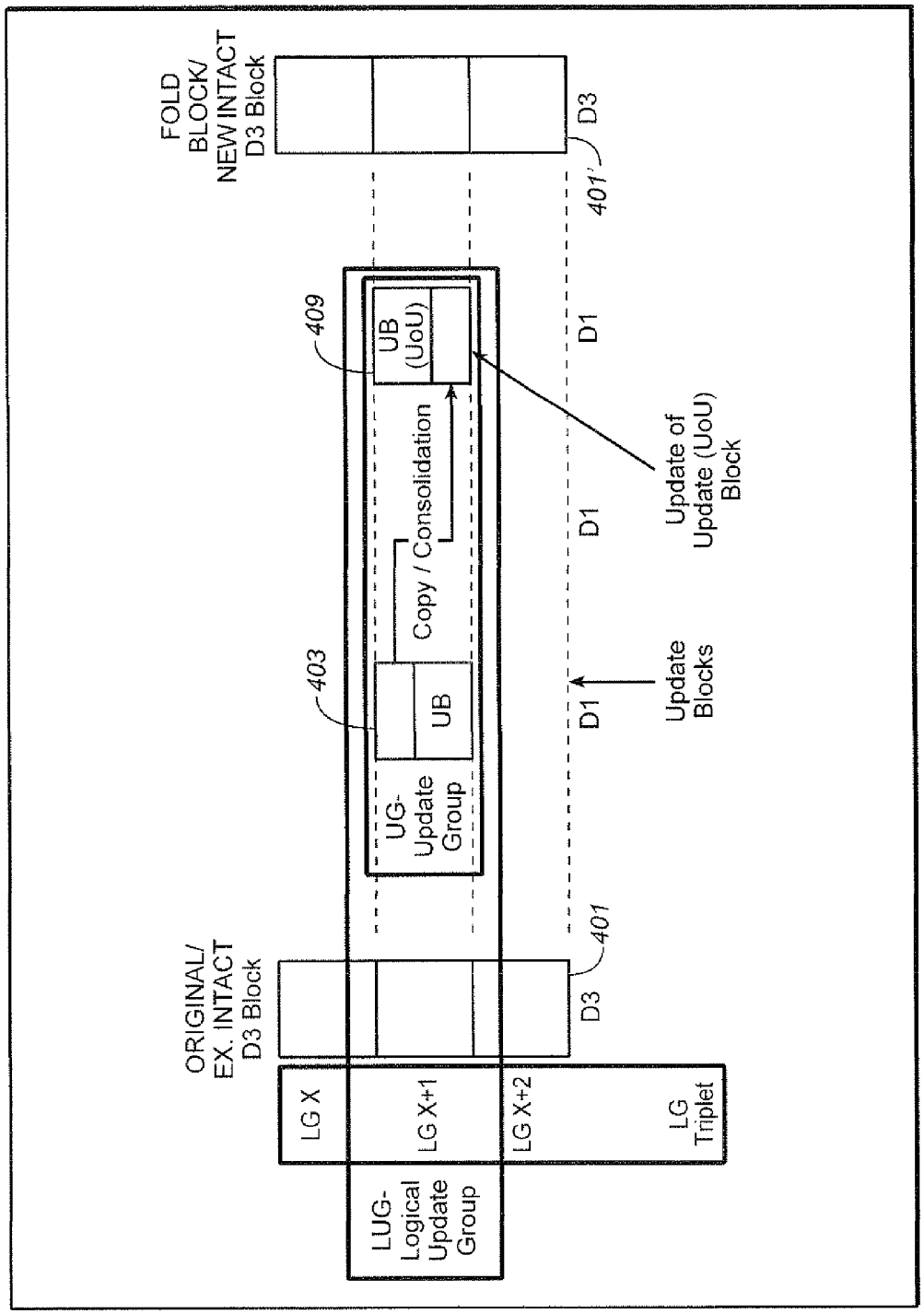

The three logical groups (here labelled as LG X, LG X+1, LG X+1) that will be stored in a common D3 metablock such as 401 are here referred to as a Logical Group Triplet. Prior to folding all related UG's for a logical group triplet will be consolidated to a single UB each, as shown in FIG. 17, where UB 403 and UB 409 are consolidated for LG X+1. The data from the original block 401 for LG X and LG X+2 is then used to be folded into the new block 401'.

Figure 18:
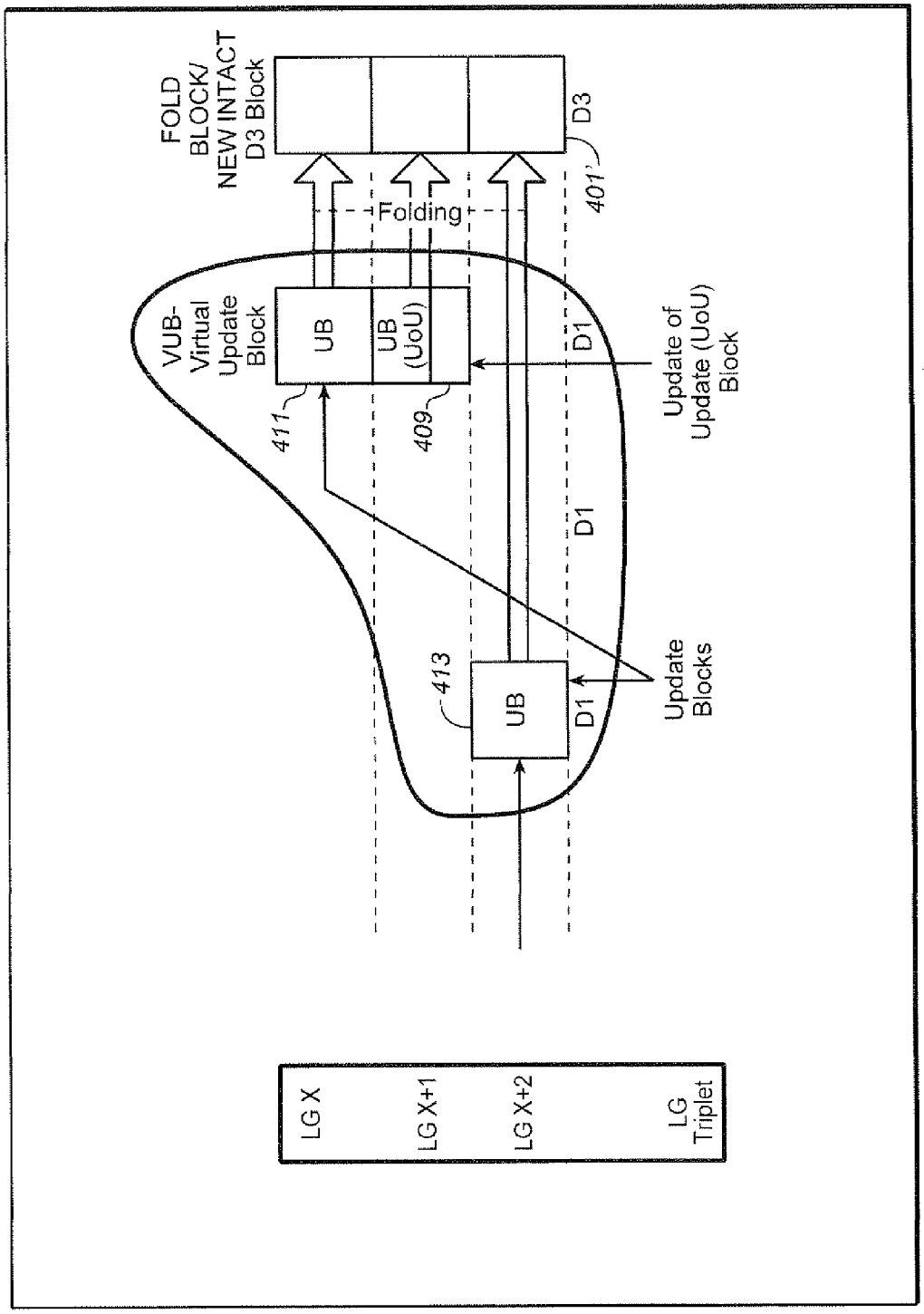

More than one of the logically groups on a D3 block can be updated in this way, as shown in FIG. 18. As shown there, all there on the logical blocks in the physical D3 block have been updated, or an update of an update, with D1 block 409, 411, and 413 before eventually being folded back into a D3 block 401'.

D1 Update Blocks can allocate dynamically, on demand. This helps to reduce the amount of copy overhead required to support operations such physical scrambling and allows for more efficient use of D1 blocks to support the update of update mechanism. For embodiments, such as the exemplary embodiment, that use on-chip data folding, all of the D1 blocks allocated to an update group for a Logical Group are located in the same die. In a multi-die configuration, the block selection algorithm preferably attempts to open virtual update blocks in all dies evenly. Once a open virtual update block is created in die X, then all other die preferably have one open virtual update block created before the next open virtual update block is created in die X. A limitation to this rule can be when other dies run out of free blocks. In addition to leveling erase/rewrite counts among all blocks, the wear leveling algorithm should preferably attempt to balance the number of free blocks between all die.

Figure 19:
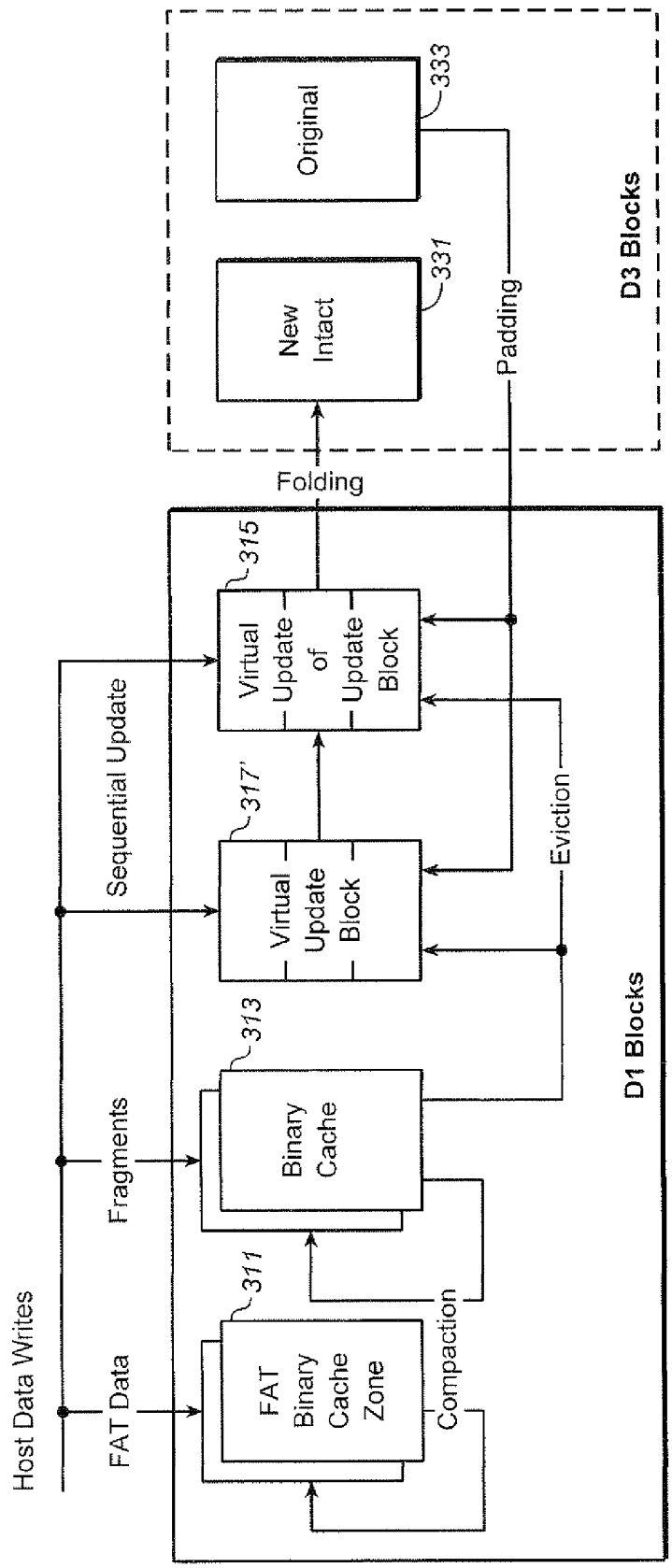
FIG. 19 shows a further example of a non-volatile memory that includes both binary and multi-state memory portions.

FIG. 19 shows an alternate embodiment. As before, the virtual update block (VUB) consists of three UBs, as it contains data for a whole D3 block before folding. The alternate embodiment differs in that the VUB has data for one D3-block-sized logical group (LG), whereas the main embodiment it has data for three D1-block-seized logical groups. As the smaller logical groups are joined into a triplet, the operation is similar: if folding is needed, the system will need to collect three D1 blocks to make full VUB before folding. The difference is that for the exemplary addressing scheme (one GAT entry per LG, where a GAT entry has meta-block address and page tag value) is that with small LGs, the system can allow individual LGs have their own page tag offset and minimise the amount of copy in the case if the host update for two or three LGs in triplet and D1 update blocks have different Page Tags. In this case, the system can combine those UBs into VUB without copy to make the Page Tag the same.

This arrangement also can support the higher performance of a parallel folding mode, such as is described in a US patent application entitled "Method and System for Achieving Die Parallelism Through Block Interleaving", having U.S. Published Application No. 2011-0153911A1 and being filed concurrently herewith, as it supports a virtual update block consolidation in that is de-coupled from folding operations. Also, as frequently updated Update blocks are in D1 blocks pool, with the D3 block pool being preferably used only for intact blocks, the system should experience higher endurance. By maintaining the update blocks in binary and only writing to MLC memory for intact blocks, this further allows for an on-chip data folding that supports physical data scrambling.

Data Transfer Flows for On-Chip Folding

The preceding sections have used the concept of on-chip data folding, where data written into a binary section of the memory is repackaged and written into a multi-state format. So far this process has only been considered in isolation, in the sense that only the individual sets of data being folded are considered. The overall flow of how data is written into binary and then on into multi-level and how relation and timing of these subprocesses interrelate has not been considered. This is considered in this and the next section. This section considers a sort of balanced flow of data from the host into binary and then on into multi-level memory through a folding operation, such as would occur when logically consecutive pages of data are transferred. The next section will also consider the case non-sequential transfers, such as the updates of the last section.

Figure 20:
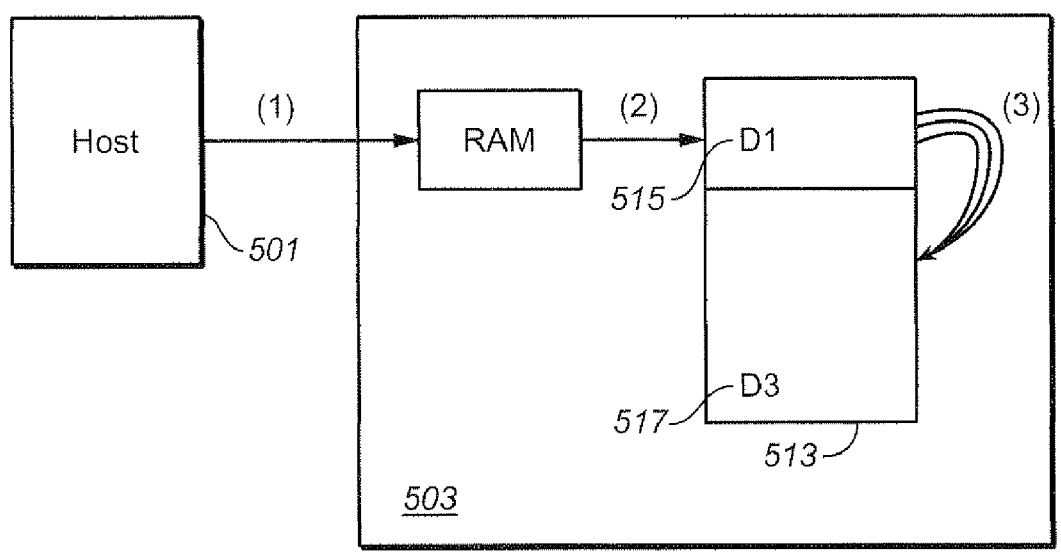
FIG. 20 is a simplified depiction of a memory system to illustrate a data transfer flow for on-chip folding.

FIG. 20 can help illustrate this process, which shows many of the elements of the memory system discussed above, but simplified for the purposes of this discussion. Data is transferred from a host 501 onto the memory 503, where it is initially stored on the volatile buffer memory RAM 511, which is typically part of the controller. From RAM 511 the data is then written into the non-volatile memory 513, first into the binary section D1 515 and then on into the MLC section D3 517. In the on-chip D1 to D3 folding operation, same read write registers and other peripheral circuitry is used for both the initial D1 write operation and the folding operation. Consequently, these operations cannot be done at the same time. For simplicity, consider the example where the host is transferring a large amount of logically consecutive data. As the volatile RAM 511 is relatively small, the data will need to be regularly written into the binary D1 memory 515; and as the D1 will eventually begin to fill up, the data will need to be folded into the D3 memory 517 in the relatively slower multi-state write operation. To optimize performance requires a balance between these operations.

In the following, the discussion will largely be presented in term of logical pages of data being received from a host and which are then written into binary, or D1 memory, where each physical page can store a single logical page of data. In the folding process, the MLC memory will be described as storing N logical pages per physical page. More generally, however, there can also be partial page operations. Also, logical data can be scattered in a more complicated fashion between physical pages, so that the folding may not be a direct 3-page (for the D1 to D3 example) to single page mapping, but more of a mapping with 3-to-1 ratio. Similarly, although a physical page (the unit that can be written concurrently) will generally be associated with a whole word line, other common arrangements can also be used.

In the following discussion will consider the data transfer flow, including the write/folding operations, read operations, and copy operations, in the context of foggy-fine method for the exemplary multi-state programming algorithm. As noted above in the discussion with respect to FIG. 7F, data content is not readily extractable at the end of the foggy programming phase. As before, the exemplary embodiment will again be based on a MLC memory storing 3-bits per cell, here referred to as D3 memory.

"Atomic write" will be used to refer to an internal folding operation that combines the first, foggy and fine programming phases together. Referring still to FIG. 7F, for a D3 write to a word line, if the first programmed is completed or only first and foggy pages are programmed, the data cannot be properly read. It is only once the associated fine page is programmed onto that word line that the three pages can be read properly. Consequently, if there is a power cycle or program failure of some sort after the first or foggy write phases, but before completing the fine phase, the memory system may have corrupted data. This situation is considered further in entitled "Atomic Program Sequence and Write Abort Detection" by Gorobets et al.

In a data transfer flow, where both binary writes and folding operations are involved, the performance of grouping all of the programming phases (such as first, foggy and fine) as a single operation, where there is no host data write to binary block in between, is not as good as the programming operation is broken up, as will now be described. The exemplary embodiment breaks the phases of the programming sequence into two parts: 1) first and foggy; 2) fine. New host data is then allowed to come in between the two phases. This allows for an improvement in performance, although it does have the drawback to this of the increasing the time during which the data being written is still a "foggy" condition which can lead to a possible write abort detection problem.

One way to avoid the write abort detection problem is that, when the host sends a power down command, the memory system will detect the host command and keeps the device busy until it finishes the fine stage. If the last write phase execute was a fine phase, the memory system need not do anything special, while if the last write is a foggy phase, the memory system can attach a fine programming and then releases to the device as ready to the host once the fine phase completes.

Returning to FIG. 20 and considering a transfer flow of data from a host 501 to the D3 portion 517 of the non-volatile memory, the flow is transferred: (1) from the host to RAM 511; (2) from the volatile RAM 511 to non-volatile D1 memory 515; and (3) folded from D1 515 to D3 517. This set of transfers can be arranged, broadly speaking, into three varieties of host data flows:

Steady state, where the amount of input to D1 is balanced to be more or less the same as the amount of folding from D1 to D3. This arrangement gives the better performance for extended transfers of sequential.

More D1 write than D1 to D3 folding. As D1 writes are faster than folding operations, this condition gives better performance at than the steady state case, but at the expense of using D1 memory blocks, which, at some point may become unsustainable.

More D1 to D3 folding than D1 write. Performance at this condition is slower than the steady state case, but, as discussed in the next section, this can be used to free up more D1 blocks in an "urgent" mode.

To get sustained performance, the system will need to reach a sort of balance between D1 host write and D1 to D3 folding. This section describes such a "balanced" mode of data transfer where there is an interleaving of folding and binary writes. The exemplary embodiment does this by interspersing writes to D1 memory between the foggy and fine (and fine and foggy) phases of the multi-level programming used in the folding process.

The transfer flow of FIG. 21 shows a first exemplary embodiment for a semi-autonomous memory array (i.e., a single die or plane). For single logical group folding in balanced mode, there are two basic scenarios. In a first, data is folded using an atomic write of (first+foggy+fine), with host transfers of data to D1 executed between these full multi-state program. FIG. 21 shows the case when D1 data writes are inserted, so that the atomic write now is (first+foggy+D1 write of host data, fine+D1 write of host data).

Referring to the bottom line of FIG. 21, this shows the stages of the D1 to D3 folding process. (Although FIG. 21 is not drawn exactly to scale, the sizes of the various elements give a reasonable approximation of the relative time scales involved.) In the exemplary embodiment, three D1 blocks are available for folding into one D3 block, so that all of these D1 data pages are available for folding to D1 For the first, foggy, and fine stages, the three word lines (call them x, y, z) from the D1 blocks are used. In the folding process, the page x is read into the read/write data latches (701) and then written into a D3 word line in a first programming step (703). For the foggy step, the x, y, and z are needed and are read into latches (705) and the memory executes a foggy write (707) to the D3 word line. The fine phase then follows, again the word lines x, y, and z are loaded into the read/write latches (709) and programmed into the D3 word line for the fine write (711). This completes the first, foggy, fine stages and the data can then be read out. (The foggy-fine programming algorithm is discussed in more detail above with respect to FIG. 7F.)

Rather than proceeding directly from the foggy phase to complete the programming of the D3 word line in the fine phase, however, these phases are split and a write to D1 is executed. The D1 write involves first transferring a data set from the controller's RAM into the memory circuit (RAM to NAND, at 721), where the data is loaded into the data latches and then written into D1 memory (Host D1 Write, at 723). A similar D1 write is then performed after the fine phase before beginning the next folding operation.

This allows for a balance to be achieved between the D1 writes and D1 to D3 folding that is here preferred for sustained writing of sequential data from a host. (It should be noted that the data being folded in 707, 711 is not the same set of data being written to D1 at 723, but a set of data from an earlier write to D1.) As data has been transferred out of RAM at 721, this has opened up the RAM, which is relatively limited capacity, to receive more data form the host; and since the host to RAM transfer does not involve the non-volatile memory circuit or use its latches, these host to RAM transfers can be hidden behind the various phases of the multi-level memory write, further improving performance. Thus, the transfers at 735 and 737 are pipelined with the fine programming phase, as were the transfers at 731 and 733 hidden behind the initial phases (701-707), which provided the data subsequently transferred out of RAM at 721. (Referring back to FIG. 20, the transfers indicated at (1) can effectively be hidden behind those indicated at (2).) This process then continues on in this way until the transfer is complete.

Considering the process of FIG. 21 in more detail for a particular embodiment, the amount of data written to D1 memory between the phases of D1 to D3 folding, after either of the fine or foggy phases, is related to the size of the RAM memory. For exemplary embodiment whose values are shown in FIG. 21, the RAM size for data transfer is set to 32 KB, so that, as seen in FIG. 21 (and also FIG. 22, discussed next), there is a transfer of 16 KB of D1 data. In theory, the RAM is filled up with 32 KB of host data during the folding process (2×16 KB). Once 16 KB is transferred into the D1 memory (at 721), but not necessarily programmed in yet (at 723), the portion of the RAM that was holding the 16 KB data can be released to take in new data.

Figure 22A:
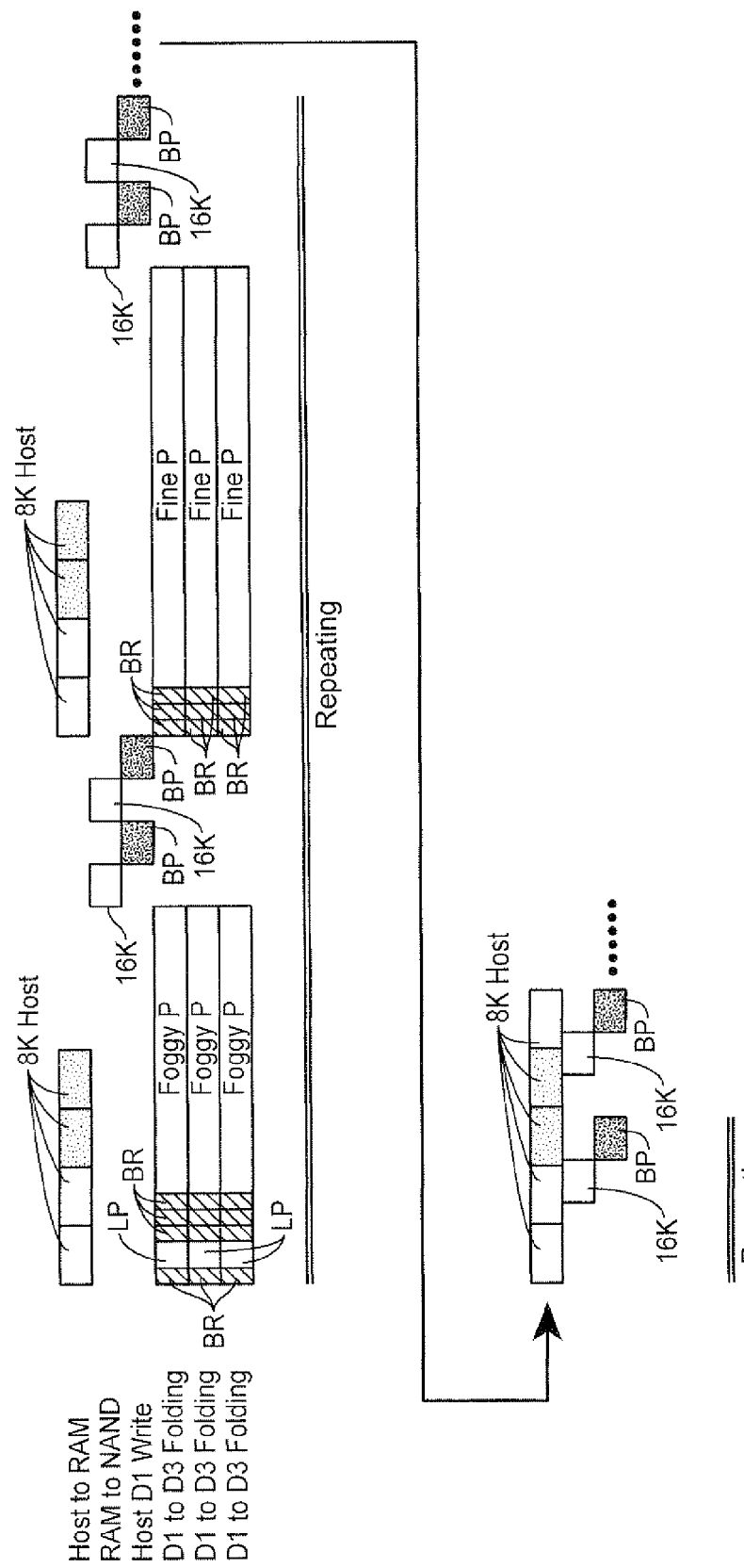
FIGS. 22A and 22B shows timing for an exemplary multi-die data transfer flow.

For increased performance, this process can also be executed in parallel across multiple dies. FIG. 22A shows a 3-die example. Here, all of the die execute the phases of the folding operations in parallel. After both the foggy and fine phases, data is again transferred from RAM to the non-volatile memory, where it is written into D1. In this example, there is a transfer of 2×16 KB of D1 data together to maximize the use of the RAM memory. The D1 transfers from RAM can be to any of the dies, for example cycling through them in order, and then all three dies run their folding phases in parallel. (More detail on such transfers is given in "Method and System for Achieving Die Parallelism Through Block Interleaving", having U.S. Published Application No. 2011-0153911A1.)

Figure 22B:
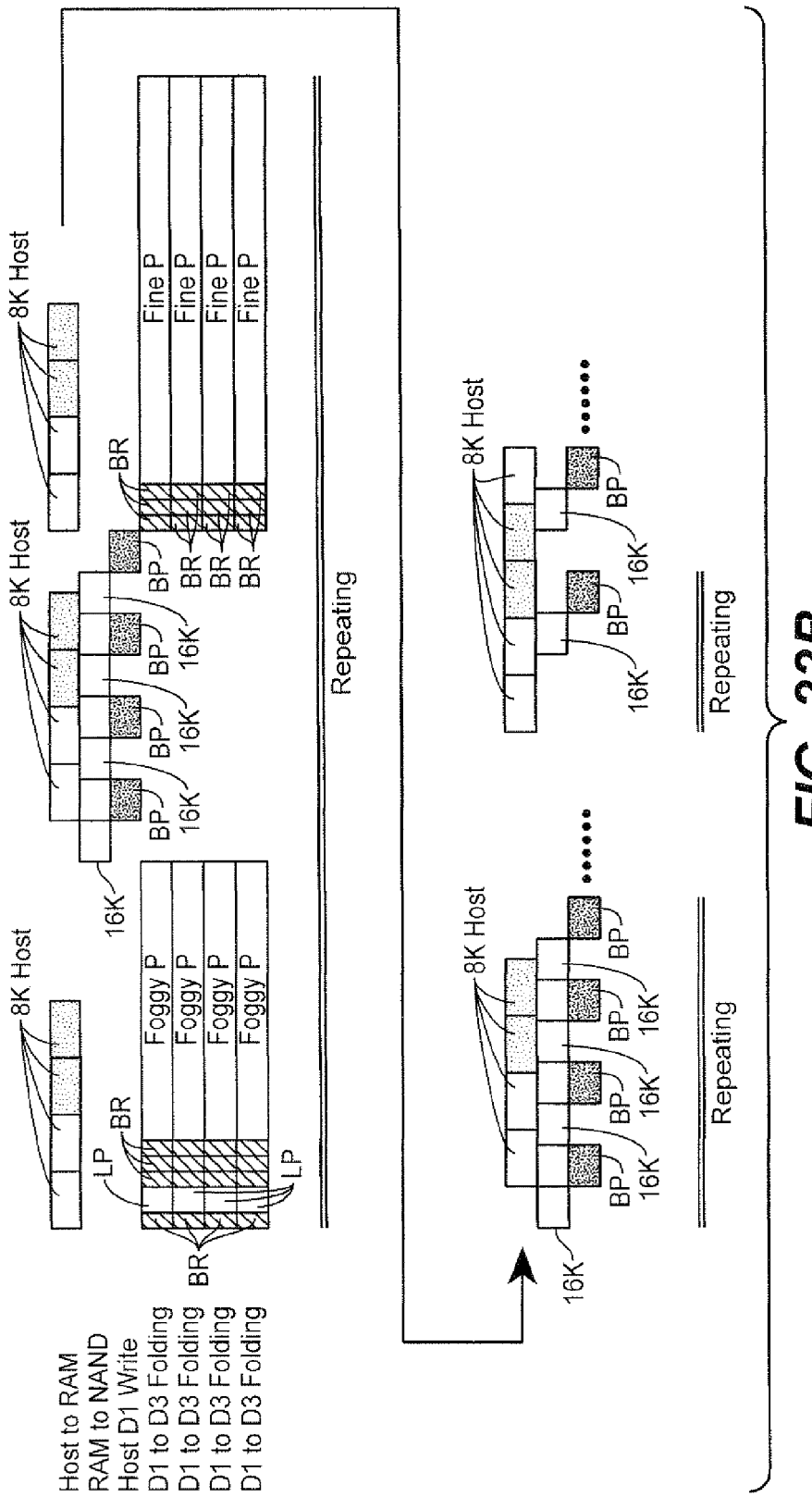

Similarly, FIG. 22B gives an example of 4-die parallelism. From the 4-die operation example, 2×32 KB of data is written to D1 in between folding phases, thereby achieving better performance. For the sort of balanced folding presented here, and also discussed further in the next section, it is preferable that the amount of folding (output) is faster that amount of D1 write (input). The reason is to be able to flush out the data in D1 to D3 faster than the system is taking in new host data to D1 in order to better prepare system D1 resources. If the host D1 write rate is more than the D1 to D3 folding rate, the system could run into a recursive condition that needs to more or less freeze for some time the D1 memory from taking in more host data. This could violate the write time out limit for some applications. For this reason, even in a balanced mode for the relative ratio of D1 writes to D1 to D3 folding, it is usually desired for the amount to be more than that of D1 writes. These concerns are considered further in the next section.

Multi-Gear Data Folding

The balanced mode of combine binary data writes with folding operation is suitable for writing quantities of logically consecutive data as it largely equalizes the rates are which host data is written into D1 memory with this data's folding into D3 memory. For other situations, it can be preferable combine these operations in different ratios. For example, if the amount of data to be transferred is relatively small, in that it will not exceed the available capacity of the D1 memory, data be more rapidly written if folding operations are suspended and all the data is written in binary form. Conversely, if the supply of D1 blocks runs low, extra folding operations may be needed to free up D1 memory.

For example, the host may send the memory a quantity of non-sequential data. This could be updated data for a number of different blocks, as described above in the Virtual Update Block section. There may be updates for a large number of blocks, but where each update is for a relatively small amount of data. This total amount of data will be transferred from the host relatively quickly, but then written into a large number of D1 memory blocks, resulting in the available number of D1 blocks being used up faster than the folding operation of the balanced more releases new D1 blocks. To handle this situation, this section introduces an "urgent mode" where a higher number of folding operations are executed. This urgent can also be invoked in other circumstances, such as when a command is recognized as allowing time for extra folding operations to added in. In addition to the balance and urgent modes, or gears, the exemplary embodiment also allows for a background mode.

In the techniques described so far, there may be dead time in the memory system as it waits for host transfers, so that the sequential write performance is not optimized. Also, the basic on-chip folding method does not account for the amount of data coining in and amount of data folded and lacks a mechanism to switch speed and control of the relative rates of these operations. To address this, the present section introduces multi-gear folding control which, in the exemplary embodiment, has three modes: 1) the balanced folding mode that optimizes the interleave of folding and host transfer for sequential performance; 2) an urgent mode, that can handle copy and other internal handling operations; and 3) a background or idle time mode to handle folding, copy, and other internal handling operations when the memory is not being actively engaged by the host. In this way, the use of RAM is optimized. The system performance is improved by increasing the amount of host-to-RAM transfer that can be hidden behind the programming operations of balanced folding. By including the background mode in addition to the urgent and folding modes, system performance is further enhanced.

Balanced mode folding uses a firmware or system algorithm to maintain sustained sequential write performance. In the architecture described above, host data must go to D1 blocks first, then get folded to D3 block. To keep sustained system write performance, over a given period of time the amount of data written to D1 should be the essentially the same as the amount of data folded from D1 to D3. One arrangement for this was presented in the last section. (More generally, balanced mode can be with or without the insertion of D1 writes between the foggy and fine phases of the folding, as described in the last section.) To maintain this balance, there should be no garbage collection and the host data coming in is in sequential order, being sent to D1 update blocks instead of binary cache. If the amount of D1 write and D1 to D3 folding is out of balance, such as, for example, more D1 writes then folding, then there will be higher burst performance for this time period. Conversely, if the amount of D1 write is less than the amount of folding, the performance is lower than sustained performance.

In urgent mode folding, the firmware/system algorithm increases the number of folding operations relative to D1 writes. For example, the number of host transfers can be reduced to the degree allowed by the host, with the extra used to concentrate on folding. This can free up update resource or allow the system to do some internal clean up operations or failure handling, such as read scrub, wear leveling, program failure handling and so on. For urgent mode folding, the sequence could also involve a preparation stage to set up the three virtual update blocks, such as shown in FIG. 18, prior to folding. In this case, there are only internal copy operations, such a (D3 read+D1 write) or (D1 read+D1 write). After the virtual update blocks are set up, the urgent folding mode can be used with primarily D1 to D3 folding being executed. Also, for cases that have a write timeout limit, the system can separate the copy operations and the folding operations into phases, with each phase being allowed at least one sector of host data write to the memory circuit meet the write time budget.

Figure 23:
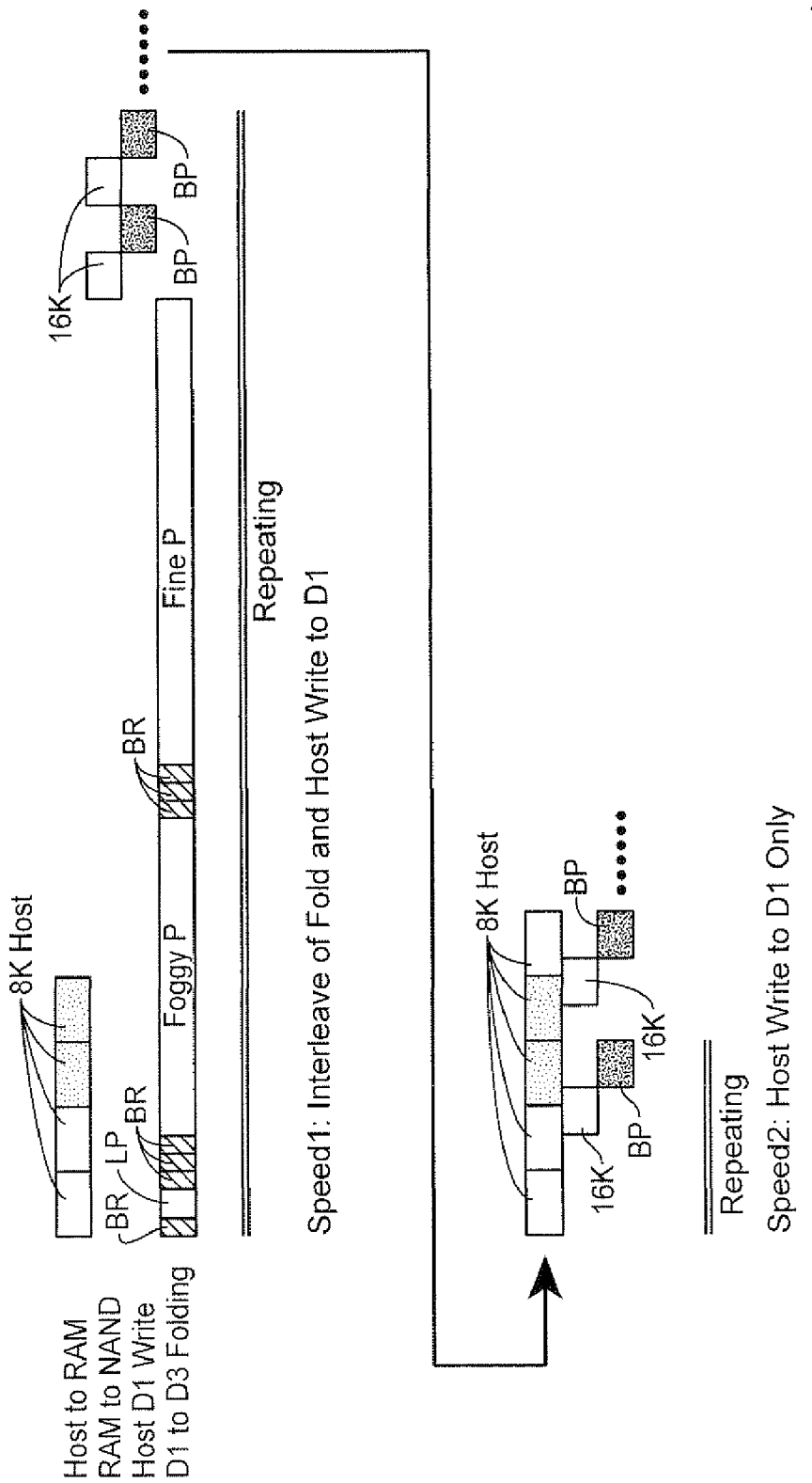
FIGS. 23-27 give examples how to combine data folding operation with writes to the binary portion of the memory

FIG. 23 shows an exemplary embodiment of a data transfer flow for a sequential write case, assuming the controller has an exemplary RAM size of 32 KB for data transfer. FIG. 23 is notated similarly to FIG. 21 and also illustrates a balanced mode folding and host data write on its left part, but for, this example, with a D1 write inserted between phases of the multi-state write used in the folding operation. (This is again for exemplary embodiment where the multi-state programming operation is of the foggy-fine variety, but, as before, other multi-phase programming operations could be used.) For a meta block write, there are two parts of operations: 1) interleave of folding and host write; and 2) Host write to D1 only.

For the first of these parts, the system will fold one meta page through each of first, foggy and fine phases of folding in series and the total data folded is 48 KB. At the same time 32 KB of host data is transferred to RAM and the host transfer time is totally hidden during the first/foggy/fine programming as host transfer is faster than 48 KB folding. After the fine phase completes programming, the 32 KB host data which is stored in the RAM is transferred to the memory; and is programmed to two D1 meta pages. Therefore, each first+foggy+fine folding (48 KB) is followed 2 binary pages write (32 KB). With such a speed and balance, when a binary block is ⅔ filled, an entire MLC block has completed from D1 to D3 folding. For the rest of the ⅓ binary block, there is continuous host write to D1 to complete the rest of the binary block, which is described in right hand side of the FIG. 23. In terms of performance, the interleave of folding and host write yields lower burst performance than sustain performance; if the host writes to D1 only mode, this yields higher burst performance than sustained performance, which is maintained on an MLC meta-block basis.

Figure 24:
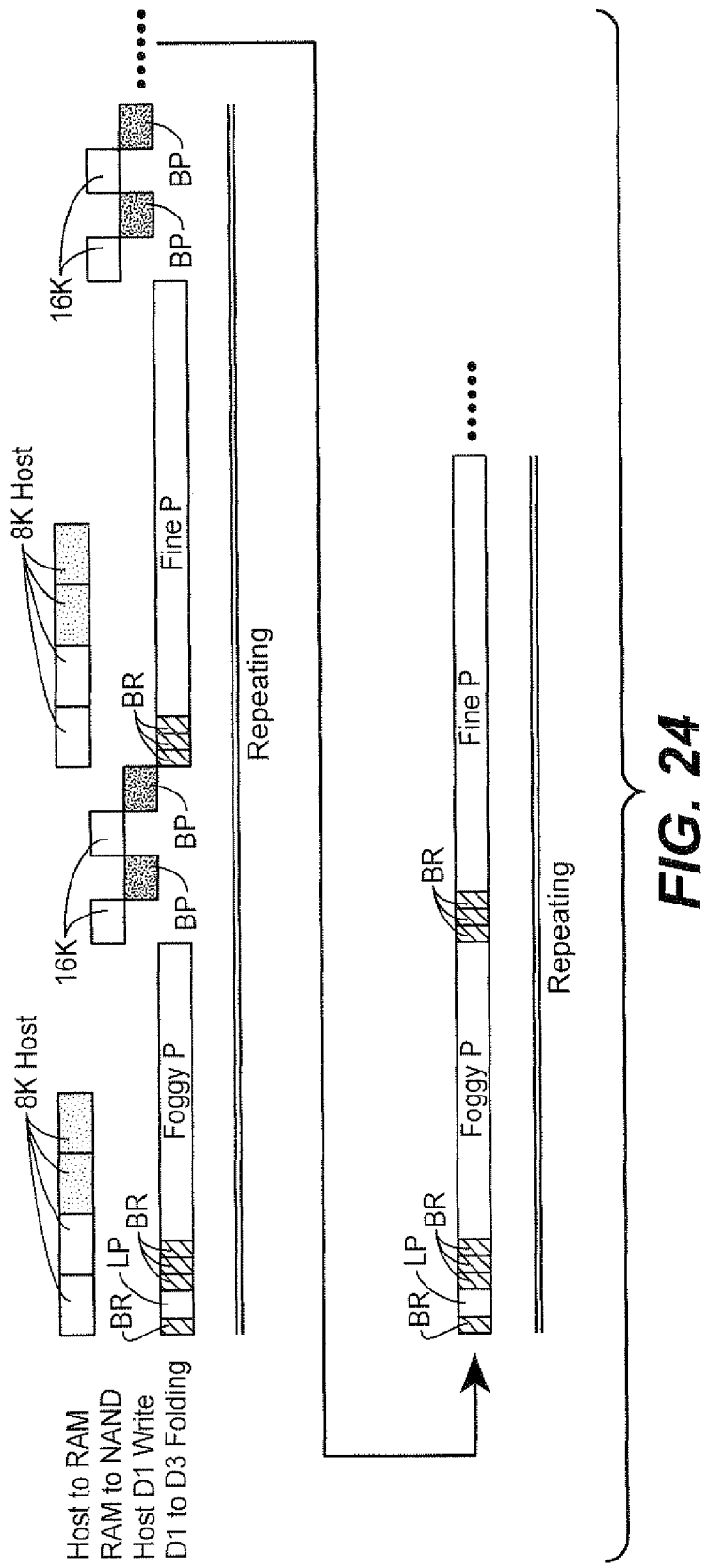
Figure 25:
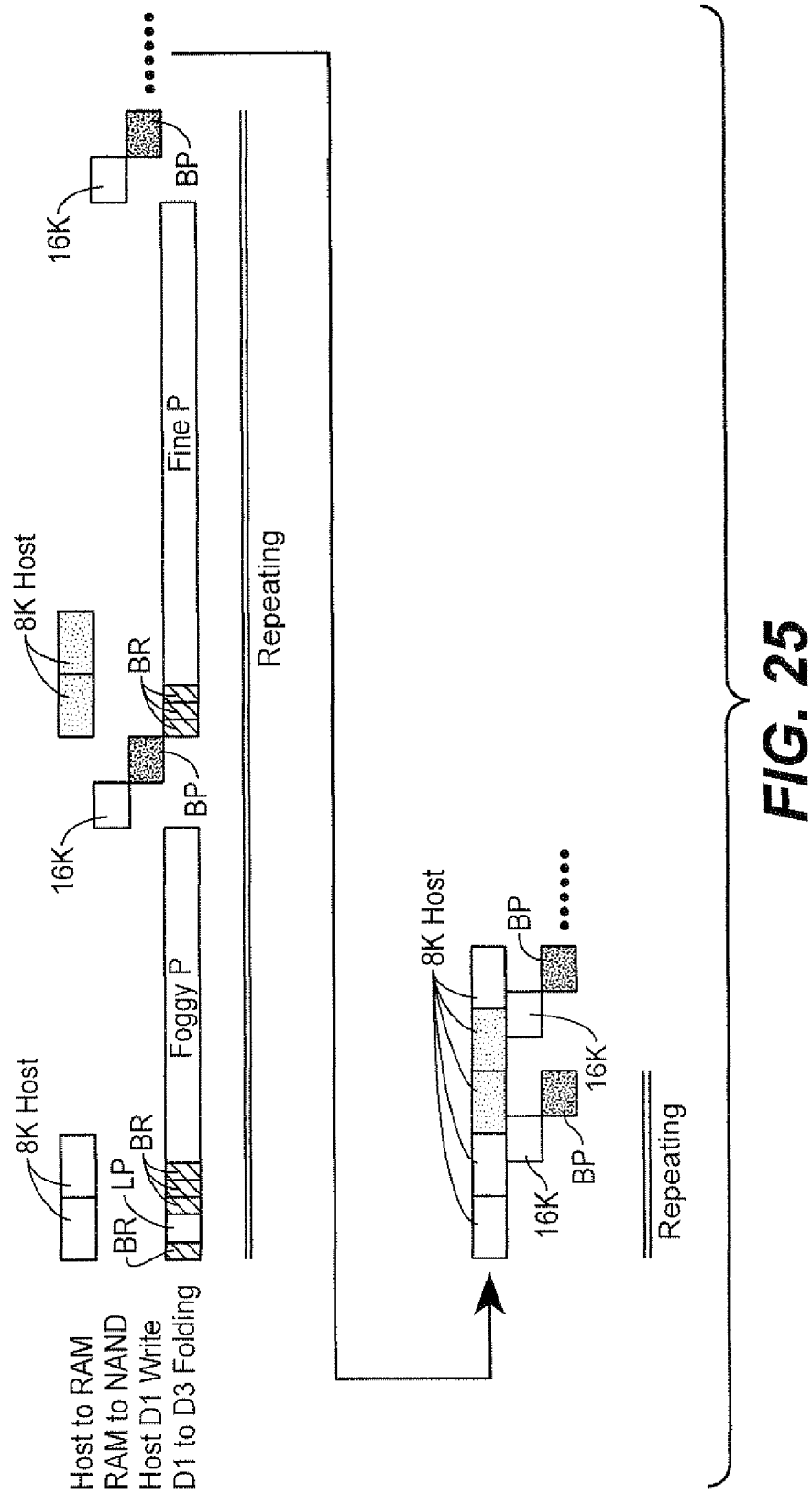

FIGS. 24 and 25 shows two variations of the (balanced mode folding+host transfer) that have different combinations of transfer sub-elements. FIGS. 24 and 25 again use single die, but now insert D1 writes between the foggy and fine phases of the folding's multi-state programming operation, much as described in the last section. These figures differ on the amount of D1 write being executed during this insertion.

There can be situations where the memory system needs to free up update block resource or perform some internal data management operations, such as program failure recovery, post-write read recovery (such as disclosed in the patent application entitled "Non-Volatile Memory and Method with Post-Write Read and Adaptive Re-Write to Manage Errors" by Dusija et al. having U.S. Published Application No. that is being filed concurrently herewith, read scrub, or wear leveling, among others. The system may go into urgent mode for garbage collection which involves copy and folding. This is considered the second mode or gear of folding control. For example, operations during the urgent mode could include D1 to D1 copy, D3 to D1 copy, or D1 to D3 urgent folding. According to product application for which the memory system is used, meta-block copy and urgent folding can be executed in series for a single host command, and there is no host transfer during garbage collection. For applications that have timeout limit (such as SD cards, where there is 250 ms write timeout limit), the excess time can be used in the urgent mode for operations such as scheduled phased garbage collection that may be required; for example, there could be a single sector host write, then x amount of copy steps preformed, or y amount of urgent D1 to D3 folding preformed, depending on the specific algorithm.

For applications that have a relatively large amount of idle time with power on from the usage model, and if these applications allow enough power budget for memory system operations, the firmware use the time to do execute background write/read/copy/folding operations to improve system performance. The firmware can choose to free up update block resource to prepare for future write commands to improve performance; or perform internal operations, such as wear leveling, read scrub, program error handling or enhanced post-write operations.

To help balance programming times during folding operation, a folding step is here defined as either 1) a first and a foggy programming operation, or 2) a fine programming operation. In the balanced folding mode, the system's firmware has folding control parameters which control the number of folding steps and the number of host writes for each task. The number of folding steps and number of host data writes may vary based on product performance and power requirements. The system firmware can dynamically increase the number of folding steps per work period if there is an urgent need to free up update blocks by completing a fold, and this will fall into the urgent mode folding control thread.

When controller's firmware recognizes that it is approaching the end of a write command, it can set a folding control flag which tell the folding task to continue so as to end on a fine programming step, even if that exceeds the specified number of folding steps per work period. This will insure that the folding task ends on a fine programming phase and that the folding process can resume from where it left off if there is power cycle between commands.

For background/idle time operations, the controller's firmware can choose to maximum the amount of folding in order to free up resources or handle other house keeping operations. When the firmware recognizes that there is a host command being issued while engaging in background folding, it needs to exit the folding quickly in order to respond to the host command. If the folding process is completed to the end of a D3 block, the firmware can choose to exit the idle time folding with a fine programming which insures the folding process can be resumed; alternately, the firmware can choose to exit the idle time folding after a programming is completed, regardless or whether it is a first, foggy or fine programming, and restart the folding process of the same virtual update block to a new D3 block when needed.

Figure 28:
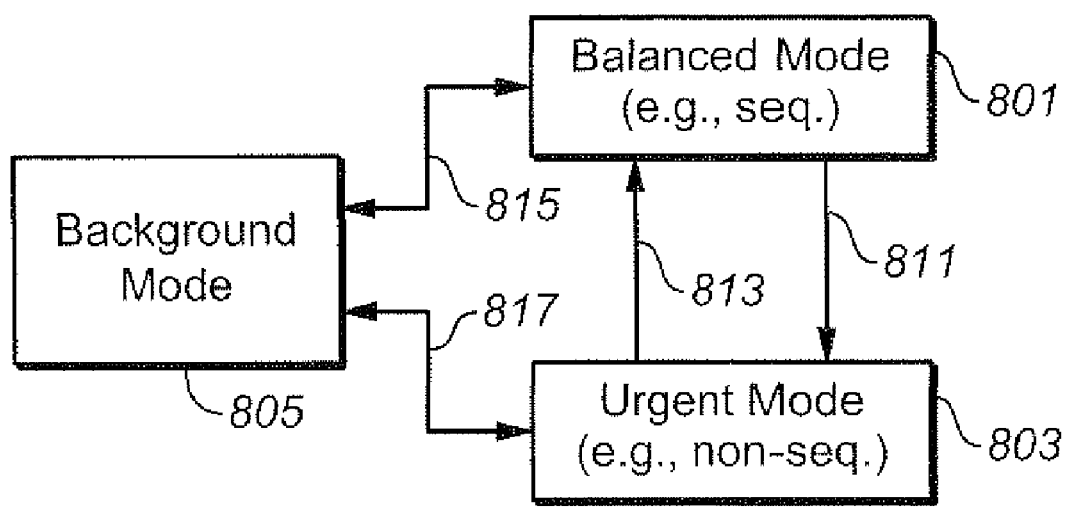
FIG. 28 is a schematic illustration of transitioning between modes of memory operation that include on-chip data folding operations.

The control mechanism with respect to switching mode is illustrated schematically in FIG. 28. The balanced mode 801 can transition to, and transition back from, the urgent mode 803. As described in the last section, either of these modes can lapse into the back ground and transition back to either mode, as shown at 815 and 817.

The balanced mode 803 is used for sequential writes and similar such operations that have a largely steady flow of data. The controller can switch to this mode from the urgent mode (813) or background (815) in response to determining the arrival of sequential data. This mode can also be used as the initial mode used when the system first interact with a host to receive data.

The transition 811 to urgent can be based on the various mechanisms discussed above, such as receiving non-sequential data or other situations where the amount of available D1 memory is low. To allow more time for the extra folding operations, the memory may send an indication to the host to slow the rate of data transfer: in some cases, the transfer could be suspended, while in other systems a minimum transfer rate must be sustained. The transition also be a response to certain commands or types of commands. For example, if a command is not performance critical, in that it need not be done as quickly as reasonably possible, but only needs to be completed with some predetermined time allotment for the performance requirement, any surplus time can be used in the urgent mode to free up D1 resources. This could be the case for transfers of control or data management data, such as file access table (FAT) updates. In other variations, writes addressed to specific addresses, such as where system control data is maintained, could trigger the urgent mode. Further examples include write or other failures, from whose recovery a significant amount of data re-write could be involved.

Figure 26:
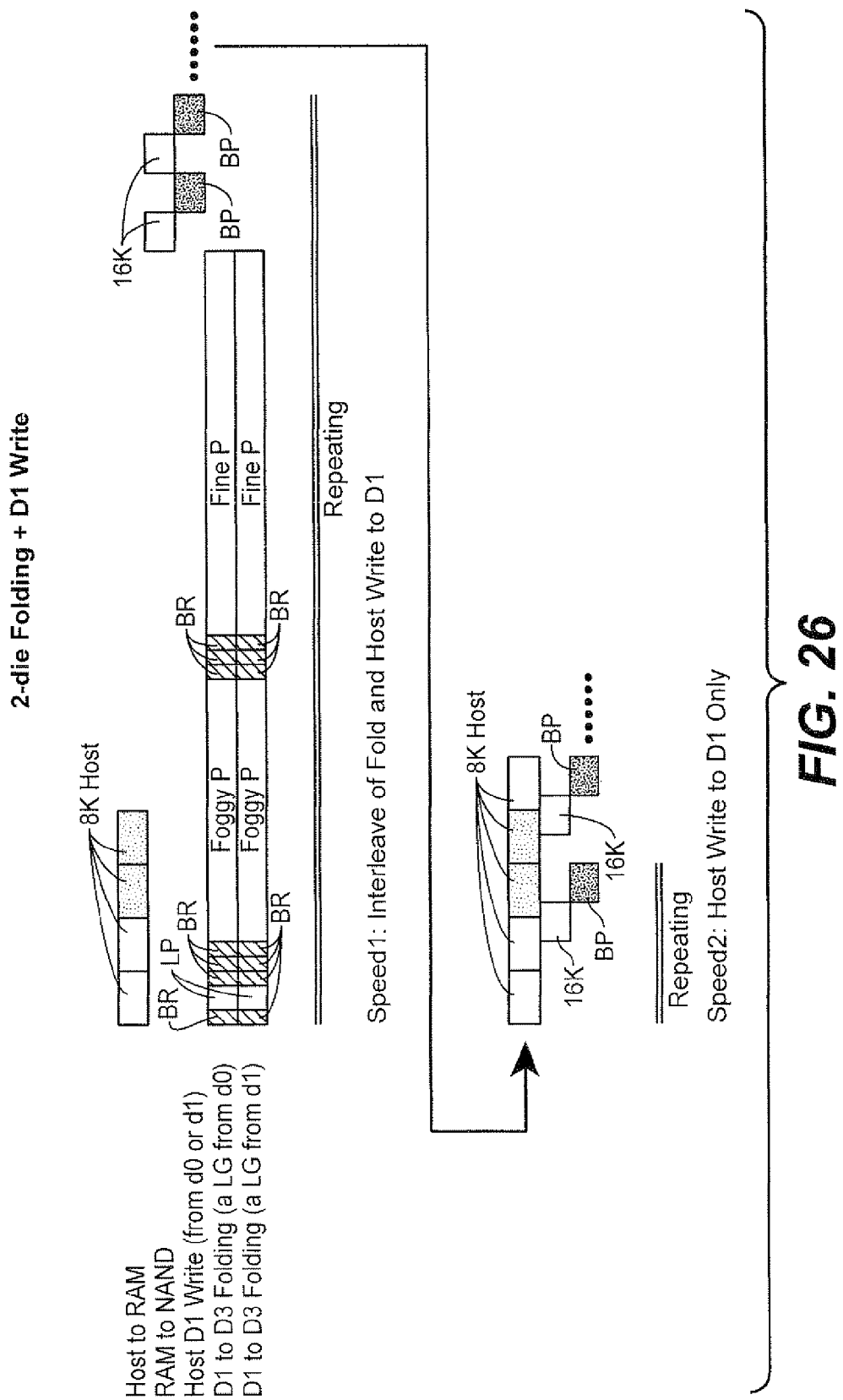
Figure 27:
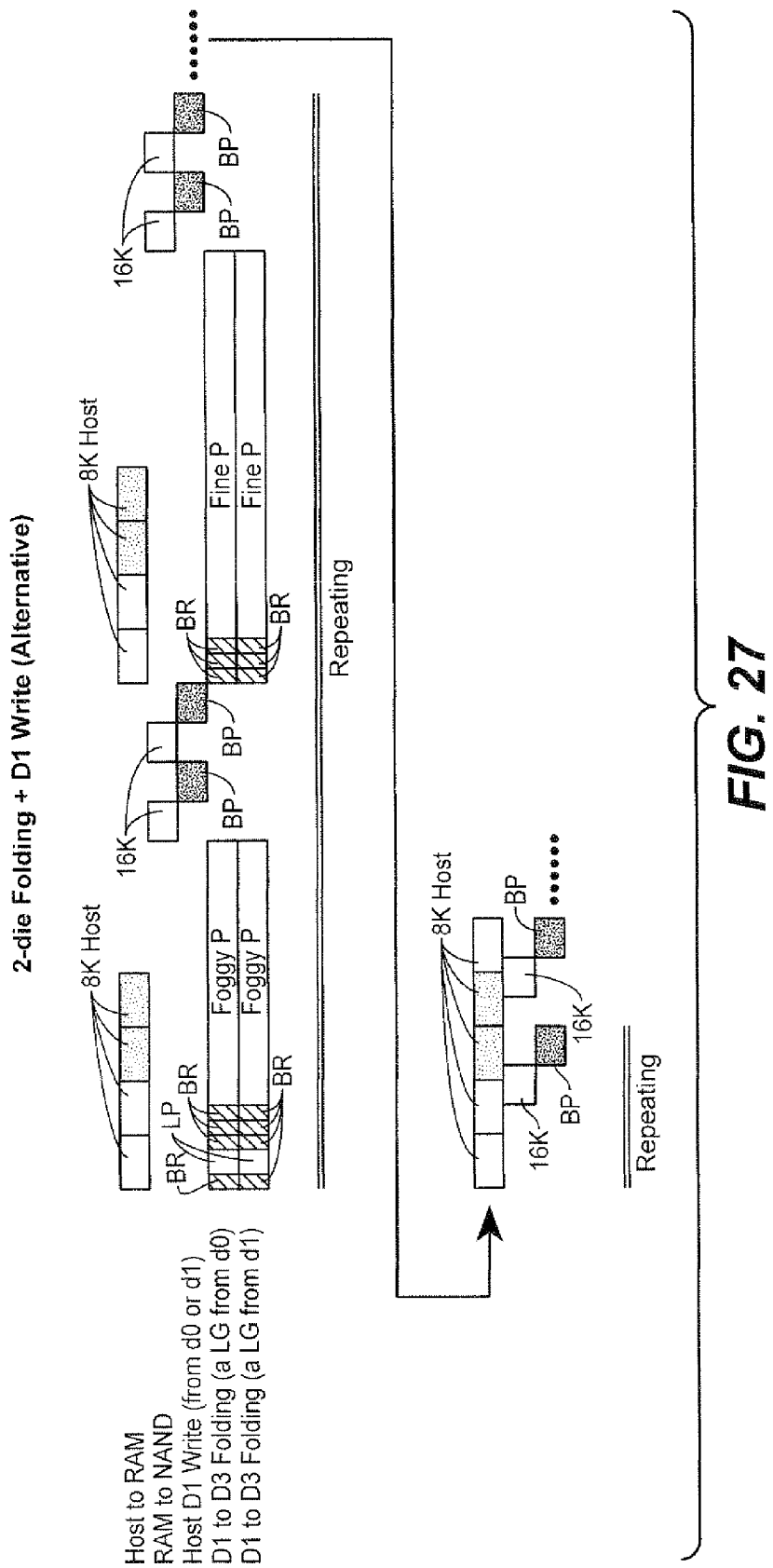

This approach of "multi-gear" folding control can also be applied to different degrees of parallelism. FIGS. 26 and 27 show 2-die parallel folding example for the balanced mode to achieve better sequential write performance. As before, D1 writes may be inserted between the foggy and fine phases, as shown in FIG. 27.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of operating a memory system including a volatile buffer memory and a non-volatile memory circuit, the non-volatile memory circuit having a first section, where data is stored in a binary format, and a second section, where data is stored in a multi-state format, the method comprising:
   receiving data from a host;
   storing the received data in the buffer memory;
   transferring the data from the buffer memory to read/write registers of the non-volatile memory circuit;
   performing a binary write operation of the data from the read/write registers to the first section of the non-volatile memory circuit; and
   subsequently folding portions of the data from the first section of the non-volatile memory to the second section of the non-volatile memory, wherein a folding operation includes:
      reading the portions of the data from multiple locations in the first section into the read/write registers; and
      performing a multi-state programming operation of the portions of the data from the read/write registers into a location of the second section of the non-volatile memory,
   wherein the multi-state programming operations include a first phase and a second phase and one or more binary write operations are performed between the phases of the multi-state programming operations.

2. The method of claim 1, wherein the second section store data in an N-bit per cell format,
   wherein the data received from the host corresponds to multiple logical pages of data and the binary write operation stores each of the logical pages of data from the read/write registers to a physical page in the first section of the non-volatile memory circuit, and
   wherein the folding operation includes:
      reading N logical pages from a corresponding N physical pages in the first section into the data read/write registers; and
      performing the multi-state programming operation of the N logical pages of data from the read/write registers into a physical page of the second section of the non-volatile memory.

3. The method of claim 1, wherein one or more binary write operations are performed subsequent to one of the first phases and prior to a following second phase.

4. The method of claim 1, wherein one or more binary write operations are performed subsequent to one of the second phases and prior to a following first phase.

5. The method of claim 1, wherein the transfers of data from the host to the buffer memory are performed concurrently with multi-state programming operations.

6. The method of claim 1, where the memory system further includes a controller circuit that manages the storage of data on the non-volatile memory circuit and the transfer of data between the memory system and a host system, and wherein the buffer memory is part of the controller circuit.

7. The method of claim 1, wherein the non-volatile memory circuit comprises a plurality of non-volatile memory cells formed along a plurality of word lines and a plurality of bits lines formed as plurality of erase blocks, and wherein the physical pages of the first and second sections belong to differing erase blocks that share a common set of bit lines.

8. The method of claim 1, wherein the multi-state programming operation uses a foggy-fine programming algorithm and the first phase includes a foggy programming operation and the second phase is a fine programming operation.

9. The method of claim 8, wherein the first phase further includes an initial programming operation prior to the foggy programming operation.

10. The method of claim 1, wherein the transfers of data from the host to the buffer memory are performed concurrently with the first and second phases of multi-state programming operations.

11. The method of claim 1, wherein the memory system includes multiple semi-autonomous non-volatile memory arrays, wherein binary write operations and the folding of pages are performed in parallel on a plurality of the semi-autonomous non-volatile memory arrays.

* * * * *